US007830080B2

(12) United States Patent
Tanada

(10) Patent No.: US 7,830,080 B2
(45) Date of Patent: Nov. 9, 2010

(54) LIGHT-EMITTING DISPLAY DEVICE WITH LIGHT-BLOCKING LAYER AND MANUFACTURING METHOD THEREOF

(75) Inventor: Yoshifumi Tanada, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 967 days.

(21) Appl. No.: 11/620,408

(22) Filed: Jan. 5, 2007

(65) Prior Publication Data

US 2007/0171144 A1 Jul. 26, 2007

(30) Foreign Application Priority Data

Jan. 7, 2006 (JP) ............................ 2006-001940

(51) Int. Cl.
*H01L 51/50* (2006.01)
*H01L 51/52* (2006.01)
*H01L 51/56* (2006.01)

(52) U.S. Cl. ...................... 313/500; 313/503; 313/505; 313/506; 445/24; 445/25

(58) Field of Classification Search ......... 313/500–512; 257/72, 40, 42; 315/169.3; 445/24, 25
See application file for complete search history.

(56) References Cited

U.S. PATENT DOCUMENTS 6,414,443 B2 * 7/2002 Tsuruoka et al. ......... 315/169.3
6,518,962 B2 2/2003 Kimura et al.
6,788,003 B2 * 9/2004 Inukai et al. ............. 315/169.3
7,365,494 B2 * 4/2008 Sato ........................ 315/169.3
7,495,257 B2 2/2009 Kawakami et al.
2001/0028060 A1 10/2001 Yamazaki et al.
2002/0125831 A1 9/2002 Inukai et al.
2003/0214467 A1 11/2003 Koyama et al.
2004/0239658 A1 12/2004 Koyama et al.
2004/0245529 A1 12/2004 Yamazaki et al.
2005/0145861 A1 7/2005 Kawakami et al.
2005/0156179 A1 7/2005 Yamagata
2005/0161680 A1 7/2005 Kawakami et al.
2005/0179372 A1 8/2005 Kawakami et al.
2006/0038501 A1 * 2/2006 Koyama et al. .......... 315/169.3
2009/0140283 A1 6/2009 Kawakami et al.

FOREIGN PATENT DOCUMENTS

JP 2003-330419 11/2003

* cited by examiner

*Primary Examiner*—Mariceli Santiago
(74) *Attorney, Agent, or Firm*—Fish & Richardson P.C.

(57) ABSTRACT

In a display device with a pixel constituted using an EL element or the like, leak light from a monitoring element that is provided for correcting changes in the properties of the element due to the temperature change, deterioration, or the like is effectively suppressed. The display device has a structure in which an insulating layer is formed over a substrate and a plurality of light emitting elements each of which has a light emitting layer interposed between a first electrode and a second electrode are formed over the insulating layer. Furthermore, at least part of the plurality of light emitting elements has a structure in which an opening is formed in the insulating layer, and the light emitting layer is formed in the opening region of the insulating layer.

18 Claims, 11 Drawing Sheets

LIGHT-EMITTING DISPLAY DEVICE WITH LIGHT-BLOCKING LAYER AND MANUFACTURING METHOD THEREOF

BACKGROUND OF THE INVENTION

1. Field of the Invention

The present invention relates to a display device and a manufacturing method of the same.

2. Description of the Related Art

In recent years, development toward the practical use of an EL display, which uses an electroluminescence element (hereinafter referred to as an EL element) for a pixel portion, has been promoted. Especially an EL display using an organic EL element can be operated with a driving voltage equivalent to that of a liquid crystal element which is mainly used in conventional flat panel displays, and the driving voltage is lower than that of an inorganic EL element. Specifically, compared to a liquid crystal display, an EL display device using an organic EL element is self-luminous, thus does not require a backlight, and its color reproducibility is high. Therefore, it is highly expected to be a key technology to the next-generation flat panel display.

On the other hand, an organic EL element has a problem in that changes in the properties, such as a reversible change associated with an environmental temperature change and an irreversible change like element deterioration caused by moisture or the like, specifically, are larger than those of an inorganic EL element. In order to ensure a constant luminance characteristic with the sufficient life cycle in a wide range of usage environments, some kind of correcting means for such changes in the properties is required.

As an example of a correcting means for the aforementioned changes in the properties, a method of keeping the value of a current supplied to an organic EL element constant can be given. In an organic EL element, the relation between a voltage applied to an element and a current flowing in the element is nonlinear, but the relation between a current flowing in the element and the luminance of light emission of the element is almost linear. Therefore, the above-described method is advantageous since it is a relatively easy way to keep the luminance constant.

As an example of the correcting means, a method in which an organic EL element for monitoring the current value (hereinafter referred to as a monitoring element) is formed in the vicinity of an organic EL element that is formed as a pixel portion, and a power supply potential of a current supply line of the organic EL element is controlled such that the value of a current flowing to the monitoring element becomes constant is proposed (see Patent Document 1: Japanese Published Patent Application No. 2003-330419).

SUMMARY OF THE INVENTION

An example structure of a display device when a monitoring element portion including a monitoring element is used as a luminance correcting means as described above is shown in FIGS. 2A to 2C. The display device shown in FIGS. 2A to 2C includes peripheral circuits 200, a pixel portion 220, and a monitoring element portion 210, using thin film transistors (hereinafter referred to as TFTs), formed over a substrate in an integrated manner.

In FIGS. 2A to 2C, the peripheral circuit constituted by TFTs 201 and 202 and the like is provided in a region indicated by a dotted frame 20; the monitoring element portion constituted by a TFT 211, a monitoring element 212, and the like is provided in a region indicated by a dotted frame 21; and the pixel portion constituted by a TFT 221, a light emitting element 222, and the like is provided in a region indicated by a dotted frame 22. These are formed over a substrate 250 formed using a material having a light-transmitting property such as glass or plastic, for example. It is to be noted that a base film 251 or the like may be formed over the substrate 250.

In addition, the peripheral circuit 200 formed over the substrate 250 is driven by control signals input from outside through a flexible printed circuit board (FPC) which is attached to a terminal 290.

The monitoring element 212 and the light emitting element 222 have pixel electrodes 213 and 223 corresponding to anodes of the EL elements, light emitting layers 214 and 224, and counter electrodes 215 and 225 corresponding to cathodes of the EL elements, respectively. When emitted light obtained from the light emitting layer is extracted to the pixel electrodes 213 and 223 side, the pixel electrodes 213 and 223 are formed using a material having a light-transmitting property, and the counter electrodes 215 and 225 are formed using a material having a light-blocking property. On the other hand, when emitted light is extracted to the counter electrodes 215 and 225 side, the pixel electrodes 213 and 223 are formed using a material having a light-blocking property and the counter electrodes 215 and 225 are formed using a material having a light-transmitting property. Here, the former case is referred to as bottom emission since light is extracted in a bottom direction of the substrate, and the latter case is referred to as top emission since light is extracted in a top direction of the substrate.

In addition to the structure above, light extraction efficiency can be improved by providing reflectivity for each of the electrodes formed using a material having a light-blocking property, which is further preferable.

When the luminance correction is performed by the monitoring element, a current is supplied to the monitoring element constantly or with a desired light emission duty ratio. Therefore, the monitoring element may emit light regardless of display of the pixel portion. Light emission of the monitoring element is not related to the display, and requires some kind of light-blocking means.

As an example of the light-blocking means, a structure in which a light-blocking layer 216 is provided in a region where the monitoring element is formed, utilizing a film used for forming a gate electrode of a TFT or a film used for forming a source wiring, a drain wiring, and the like when the peripheral circuit is formed as shown in FIG. 2B, or the like can be given. In a case of the bottom emission, light emitted in the bottom direction of the substrate is blocked by the light-blocking layer 216, and does not appear outside. At this time, since the counter electrode 215 is formed using a material having a light-blocking property, light does not leak on a top surface side of the substrate.

Furthermore, in a case of the top emission, a light-blocking layer can be selectively formed in a region where the monitoring element is provided, by making the counter electrode 235 have a stacked structure of a film 231 formed using a material having a light-transmitting property and a film 232 formed using a material having a light-blocking property, as shown in FIG. 2C.

However, with the structures shown in FIGS. 2A to 2C, light leaks through the route as indicated by an arrow 291, although the light-blocking layer performs favorable light-blocking on the top and bottom sides of the substrate 250. That is, light emitted from the monitoring element sometimes passes through insulating layers formed between layers such as an Si film, a gate electrode, and a wiring which constitute a TFT, is reflected by a wiring, a light-blocking layer, or the like formed adjacent to the monitoring element, and comes through in a horizontal direction. In order to prevent this leak light from affecting the display, it is necessary to provide a sufficient distance in a horizontal direction between a monitoring element portion and a pixel portion so that light from the monitoring element fades enough in a step of coming through in a horizontal direction while being reflected by the wiring, the light-blocking layer, or the like formed adjacent to the monitoring element. In addition, it is necessary to provide a light-blocking layer widely enough.

On the other hand, it is necessary that a pixel portion and a monitoring element portion are arranged close to each other so that behavior of property changes of an EL element used as a light emitting layer for each of them is equal to each other as much as possible. When there is a distance between the pixel portion and the monitoring element portion, influence of variation in formation steps of the light emitting layer or the like becomes larger, which makes accurate luminance correction difficult. Furthermore, there may be a case where a sufficient distance between the pixel portion and the monitoring element portion cannot be ensured because of a problem in size of a display device and a problem in layout of elements.

Therefore, light emitted from the monitoring element is not sufficiently blocked and the light leaks in the pixel portion, which leads to deterioration of display quality.

In view of the foregoing problem, it is an object of the present invention to provide a display device in which a pixel portion and a monitoring element portion are arranged close to each other so that accurate luminance correction and sufficiently high integration of the pixel portion, the monitoring element portion, and a peripheral circuit are achieved, and a favorable light-blocking property can be ensured with respect to a horizontal direction of a substrate; and a manufacturing method thereof.

The reason why light leaks in a horizontal direction to the substrate is that, in a structure around the monitoring element, one or more insulating layers having a light-transmitting property are formed between a film used as a light-blocking layer and a pixel electrode, and light emitted from a light emitting layer of the monitoring element passes through the insulating layer to leak in the horizontal direction to the substrate. Therefore, according to the present invention, an insulating layer formed in a region overlapping a light emitting layer of a monitoring element is removed by patterning so as to form a depression; a light emitting element including the light emitting layer, a pixel electrode, and a counter electrode is formed in this region; and the light emitting layer is sealed with a light-blocking layer and the counter electrode. By applying such a structure to a monitoring element in a monitoring element portion, a route through which light emitted from the light emitting layer leaks can be eliminated not only for a vertical direction but also a horizontal direction to a substrate. Therefore, a favorable light-blocking property can be obtained even when the monitoring element portion and the pixel portion have no distance between each other.

According to the present invention, light-blocking around the monitoring element can be performed favorably without providing a distance between the pixel portion and the monitoring element portion and without extending the light-blocking layer in the horizontal direction to the substrate. As a result, the monitoring element portion can be arranged in a region closer to the pixel portion, therefore, characteristics of EL elements in the pixel portion and the monitoring element portion can be made closer to each other and the luminance correction and the like can be performed more favorably. Because of these two points, favorable display that is not affected by leak light of the monitoring element and favorable display due to the more accurate luminance correction can be obtained.

DETAILED DESCRIPTION OF THE INVENTION

Figure 1A:
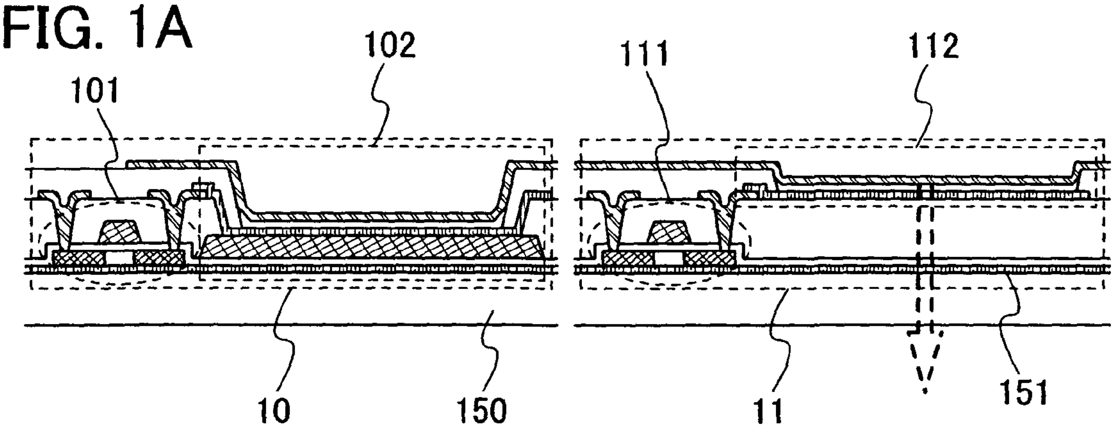
FIGS. 1A to 1C are views showing an embodiment mode of the present invention.

Embodiment modes and embodiments of the present invention will be explained below with reference to the accompanying drawings. It is to be noted that the present invention can be implemented in various ways, and it is to be easily understood by those skilled in the art that the modes and details can be changed in various ways without departing from the spirit and scope of the present invention. Therefore, the present invention should not be interpreted as being limited to the following description of the embodiment modes. It is to be noted that identical portions or portions having the same function in the accompanying drawings are denoted by the same reference numerals unless there is trouble, and repeated descriptions thereof will be omitted.

EMBODIMENT MODE 1

FIG. 1A is a view showing a mode of implementing the present invention. In a region indicated by a dotted frame 10, a TFT 101 and a monitoring element portion including a monitoring element 102 which is a light emitting element and the like are provided. In a region indicated by a dotted frame 11, a TFT 111 and a pixel portion including a light emitting element 112 and the like are provided. These are formed over a substrate 150 which is formed using a material having a light-transmitting property, such as glass or plastic. A base film 151, a gate insulating film 152, and the like may be formed over the substrate 150. Furthermore, although the peripheral circuit 200 which is shown in FIG. 2A for the related art is not shown in FIGS. 1A to 1C, it may be provided in the vicinity of the monitoring element portion or the pixel portion.

Figure 1B:
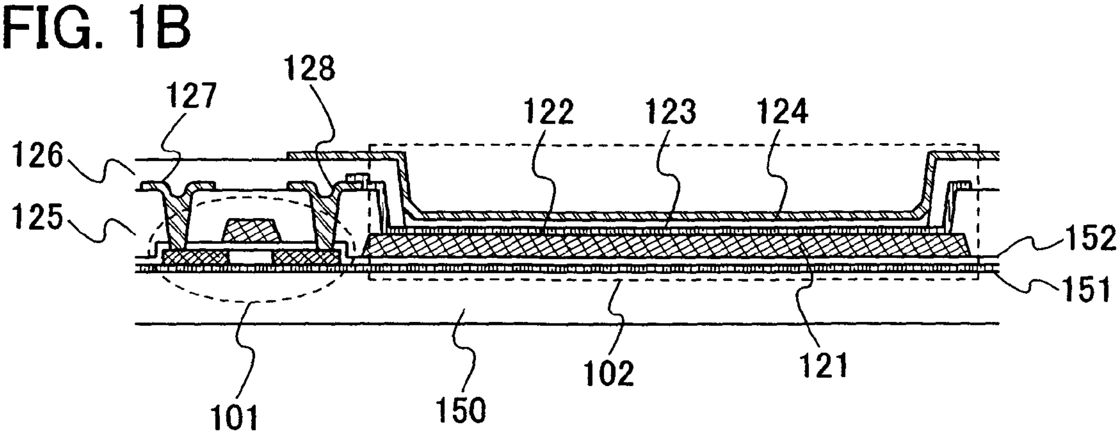
Figure 2A:
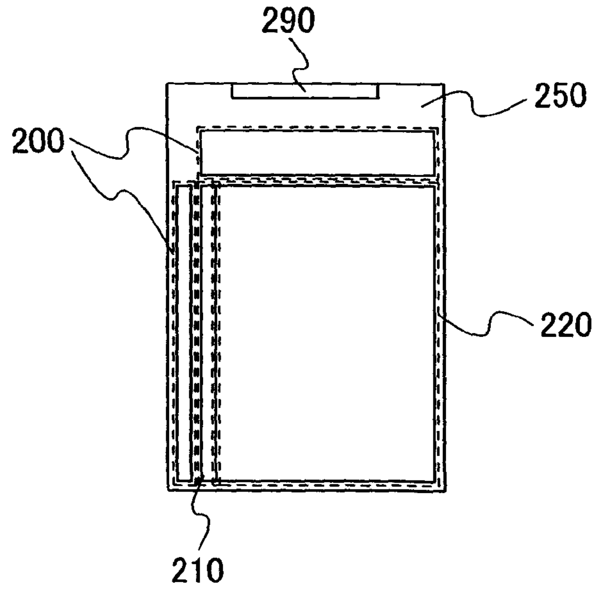
FIGS. 2A to 2C are views showing the whole image and cross-section of a conventional display device.
Figure 2B:
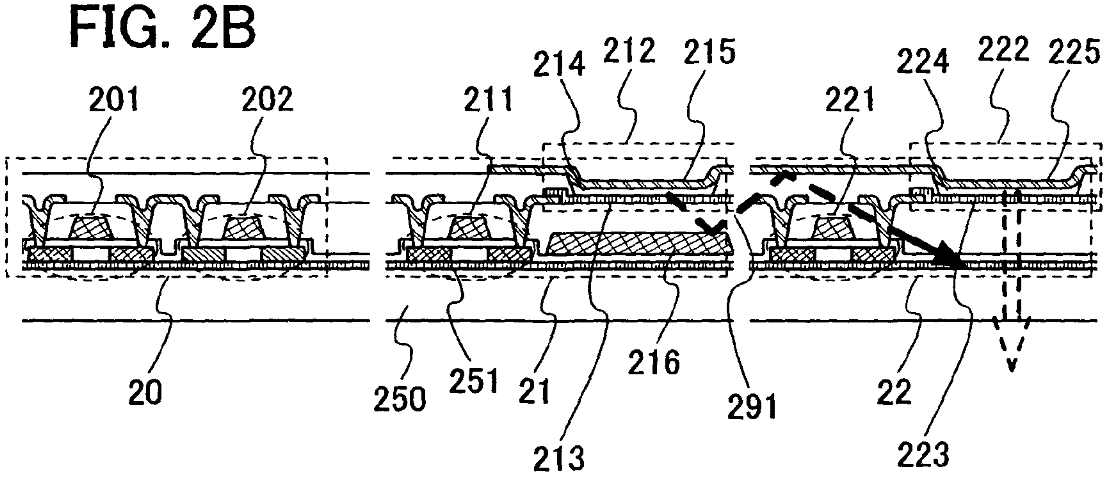
Figure 2C:
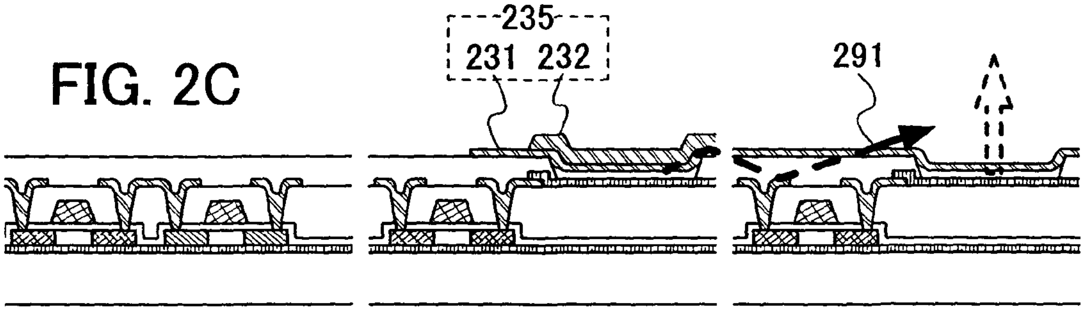

FIG. 1B is an enlarged view of the monitoring element portion shown in FIG. 1A. Concurrently with forming the TFT 101, a light-blocking layer 121 is formed utilizing a film forming a gate electrode. After that, an interlayer film 125 is formed as an insulating layer, contact holes are provided therein, and wirings 127 and 128 are formed. Concurrently with forming the contact holes, part of the interlayer film 125 overlapping a region where the monitoring element 102 is to be formed, namely a region where the light-blocking layer 121 is formed, is removed. Next, a pixel electrode 122 is formed, and a partition 126 for separation of a light emitting layer is formed. A light emitting layer 123 is formed in an opening region of the partition 126, and a counter electrode 124 is formed lastly.

In a region where the monitoring element 102 is formed, a depression is formed by removing the interlayer film 125. After that, the light emitting element including the pixel electrode 122, the light emitting layer 123, and the counter electrode 124 is formed. With such a structure, the light emitting layer 123 and the light-blocking layer 121 are extremely close to each other. By applying this structure to the monitoring element 102, a route through which light emitted from the light emitting layer 123 leaks around the monitoring element by reflection or scattering can be eliminated.

Figure 1C:
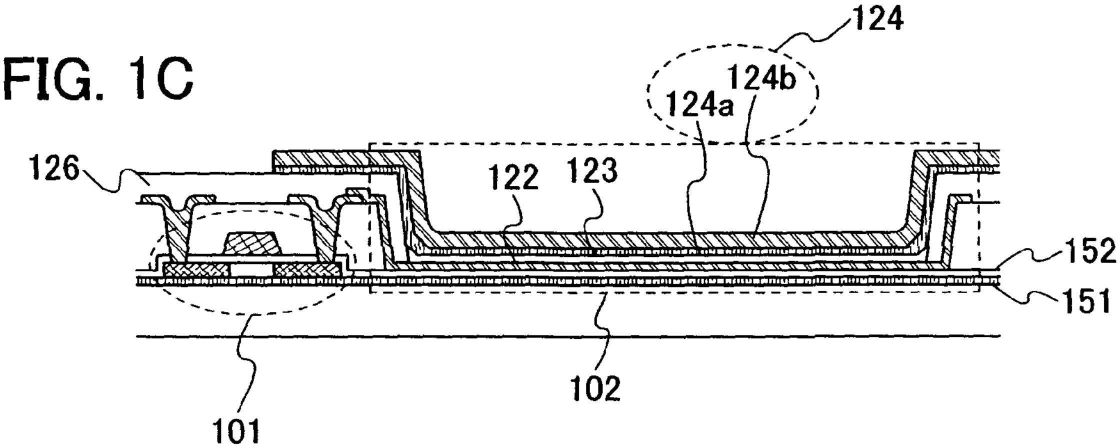

Although the description of the bottom emission case is made in FIGS. 1A and 1B, top emission can employ a similar structure so that leak light from the monitoring element in the monitoring element portion can be prevented. A structure of the top emission case is shown in FIG. 1C. By making the counter electrode 124 have a stacked structure of a film 124*a* formed using a material having a light-transmitting property and a light-blocking layer 124*b* formed using a material having a light-blocking property, the light-blocking layer can be selectively formed in a region where the monitoring element is provided. At this time, the light-blocking layer 121 which is used for blocking light emitted to the substrate 150 side may not necessarily be provided in the top emission case.

Although a pixel portion is not shown in FIG. 1C, the counter electrode of the light emitting element should be formed using only the film 124*a* using a material having a light-transmitting property so that light emitted from the light emitting layer can be extracted in the top surface direction.

By applying the structure shown in FIG. 1B to the monitoring element in the monitoring element portion, the distance between the light emitting layer 123 and the light-blocking layer 121 can be extremely small, and leak light around the monitoring element caused by reflection and scattering of emitted light can be prevented.

Furthermore, by applying the structure shown in FIG. 1C preferred to the top emission case, leak light from the light emitting layer 123 in a horizontal direction to the substrate 150 can be blocked by the pixel electrode 122 formed using a material having a reflective or light-blocking property and the counter electrode 124 including the light-blocking layer 124*b*; therefore, suppression of leak light is realized more effectively.

EMBODIMENT MODE 2

FIGS. 3A to 3D show a different mode of the structure shown in FIG. 1B. In the top emission case, the pixel electrode formed using a material having reflectivity or a light-blocking property and the counter electrode including the light-blocking layer surround the light emitting layer in the horizontal direction as well (as shown in FIG. 1C). In the bottom emission case, however, the structure shown in FIG. 1B may not sufficiently prevent leak light since only the pixel electrode formed using a material having a light transmitting property surrounds the light emitting layer in the horizontal direction.

As the countermeasure against this, there is a method in which a structure using a material having a light-blocking property is formed in the horizontal direction. Hereinafter, the method will be described in detail referring to FIGS. 3A to 3D.

Figure 3A:
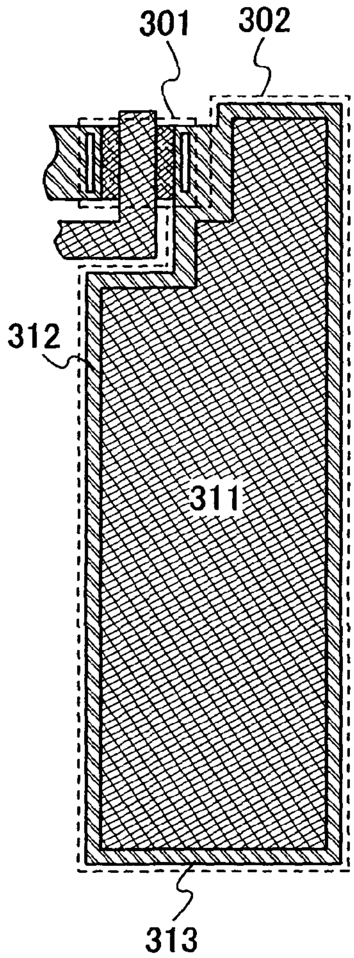
FIGS. 3A to 3D are views showing an embodiment mode of the present invention.
Figure 3B:
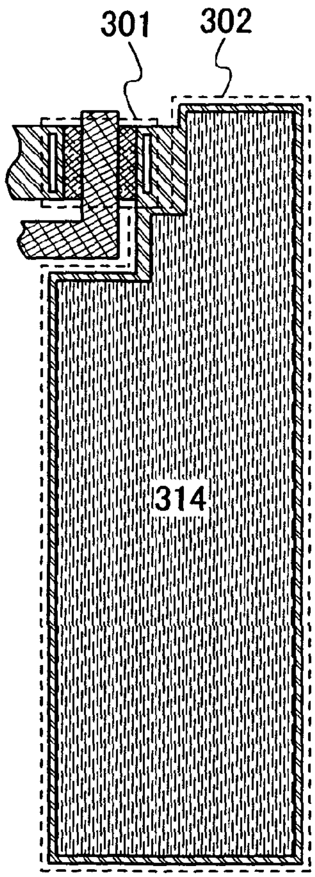
Figure 3C:
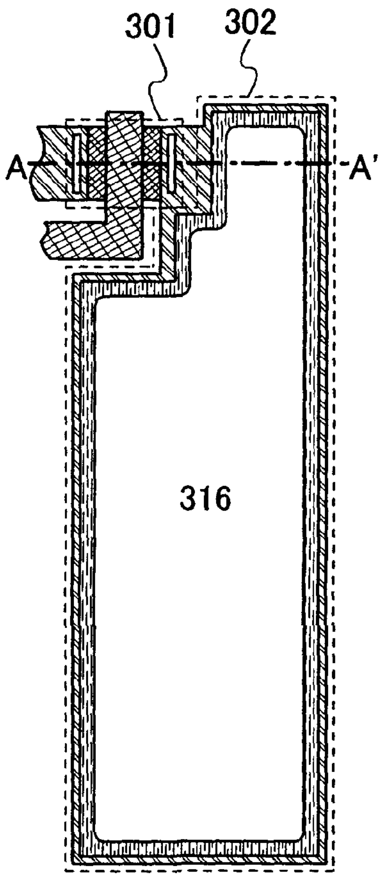
Figure 3D:
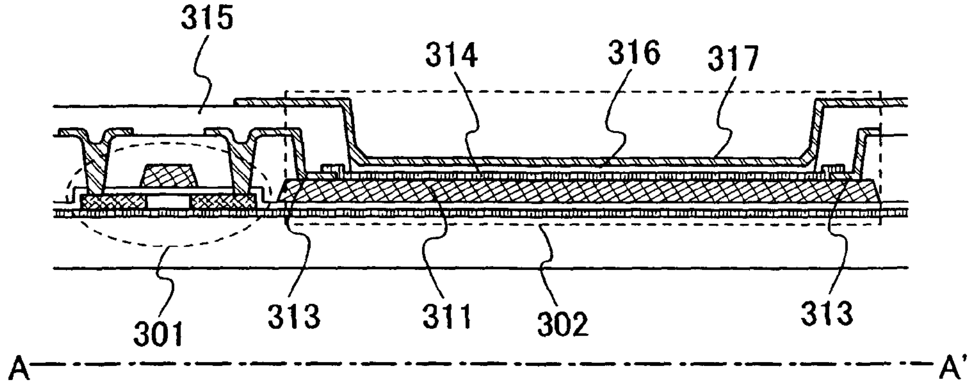

FIGS. 3A to 3C show structures of the monitoring element portion seen from the top, and a cross-sectional structure along line A-A' in FIG. 3C is shown in FIG. 3D.

As shown in FIG. 3A, an interlayer film 312 is formed after forming a TFT 301, and openings are formed in desired regions. Here, the openings are formed in the points where connection with a source region and a drain region of the TFT 301 is to be made, and the region where the monitoring element is to be formed later, that is, the region overlapping the light-blocking layer 311 (in FIGS. 3A to 3C, the edge of the opening portion over the light-blocking layer 311 is indicated by a dotted frame 302). After that, a source electrode and a drain electrode of the TFT are formed from a wiring material, and a wiring pattern 313 is concurrently formed so as to cover the opening of the interlayer film 312 (the portion indicated by the dotted frame 302).

Next, as shown in FIG. 3B, a pixel electrode 314 is formed so as to overlap the light-blocking layer 311 and cover the inner periphery of the wiring pattern 313.

After that, a partition 315 is formed so as to cover the edge of the pixel electrode 314, and a light emitting layer 316 is formed in a region surrounded by the partition 315 and where the surface of the pixel electrode 314 is exposed (FIG. 3C). Lastly, a counter electrode 317 is formed; thereby forming the structure shown in FIG. 3D.

In this structure, light emitted from the light emitting layer 316 is mainly blocked by the light-blocking layer 311 and the counter electrode 317, and light slightly leaking in the horizontal direction is blocked by the wiring pattern 313 provided around the edge of the opening of the interlayer film 312; therefore, a more preferable light-blocking property is realized.

The embodiment mode is described in the above, however, the present invention also includes a mode described hereinafter.

A display device provided with a plurality of light emitting elements each of which includes a light emitting layer interposed between a pair of electrodes, including: an insulating layer formed using a single layer or a plurality of layers; a first light emitting element formed over the insulating layer; a light-blocking layer selectively formed below the insulating layer; and a second light emitting layer provided so as to overlap an opening formed in at least one layer of the insulating layer formed using the single layer or the plurality of layers. One of the electrodes of the second light emitting element is arranged at the bottom of the opening, and the other electrode of the second light emitting element has reflectivity or a light-blocking property.

A display device provided with a plurality of light emitting elements in each of which a first electrode having a light-transmitting property, a light emitting layer, and a second electrode having reflectivity or a light-blocking property are stacked sequentially, including: an insulating layer formed using a single layer or a plurality of layers; a first light emitting element formed over the insulating layer; a light-blocking layer selectively formed below the insulating layer; and a second light emitting element provided so as to overlap an opening formed in at least one layer of the insulating layer formed using the single layer or the plurality of layers. One of the electrodes (the first electrode) of the second light emitting element is arranged so as to overlap the light-blocking layer at the bottom of the opening.

A display device provided with a plurality of light emitting elements in each of which a first electrode having reflectivity or a light-blocking property, a light emitting layer, and a second electrode having a light-transmitting property are stacked sequentially, including: an insulating layer formed using a single layer or a plurality of layers; a first light emitting element formed over the insulating layer; and a second light emitting element provided so as to overlap an opening formed in at least one layer of the insulating layer formed using the single layer or the plurality of layers. The first electrode is arranged at the bottom side of the opening, and a light-blocking layer is formed over the second electrode of the second light emitting element.

In the above-described display device, the periphery of the opening formed in the insulating layer is coated with a material having reflectivity or a light-blocking property at least against visible light.

A light-blocking layer is selectively formed; the insulating layer constituted by a single layer or a plurality of layers is formed over the light-blocking layer; an opening is formed by removing a portion of the insulating layer overlapping the light-blocking layer; a first electrode is formed over the insulating layer, and a second electrode is formed in the portion overlapping the light-blocking layer in the opening, respectively; a first light emitting layer is formed over the first electrode, and a second light emitting layer is formed over the second electrode, respectively; and a third electrode and a fourth electrode each of which has reflectivity or a light-blocking property are formed over the first light emitting layer and the second light emitting layer, respectively.

A light-blocking layer is selectively formed; an insulating layer constituted by a single layer or a plurality of layers is formed over the light-blocking layer; an opening is formed by removing a portion of the insulating layer overlapping the light-blocking layer; the periphery of the opening is coated with a film having reflectivity or a light-blocking property; a first electrode is formed over the insulating layer, and a second electrode is formed so as to overlap the light-blocking layer in the opening and cover the edge of the film, respectively; a first light emitting layer is formed over the first electrode, and a second light emitting layer is formed over the second electrode, respectively; and a third electrode and a fourth electrode each of which has reflectivity or a light-blocking property are formed over the first light emitting layer and the second light emitting layer, respectively.

An insulating layer constituted by a single layer or a plurality of layers is formed; an opening is formed by removing the insulating layer; a first electrode and a second electrode each of which has reflectivity or a light-blocking property are formed respectively over the insulating layer and in the opening thereof; a first light emitting layer is formed over the first electrode, and a second light emitting layer is formed over the second electrode, respectively; a third electrode is formed over the first light emitting layer, and a fourth electrode is formed over the second light emitting layer, respectively; and a light-blocking layer is formed over the fourth electrode.

EMBODIMENT 1

Formation of a display device having the structure of the present invention will be described with reference to drawings. Here, each step will be described in order, using FIGS. 4A and 4B. Although FIGS. 4A and 4B show a cross-section of only a monitoring element portion, TFTs, a wiring and the like constituting a peripheral circuit may be formed concurrently with a step of forming a TFT included in the monitoring element portion, and a pixel portion may be formed in the same way; therefore, they are not illustrated here.

Figure 4A:
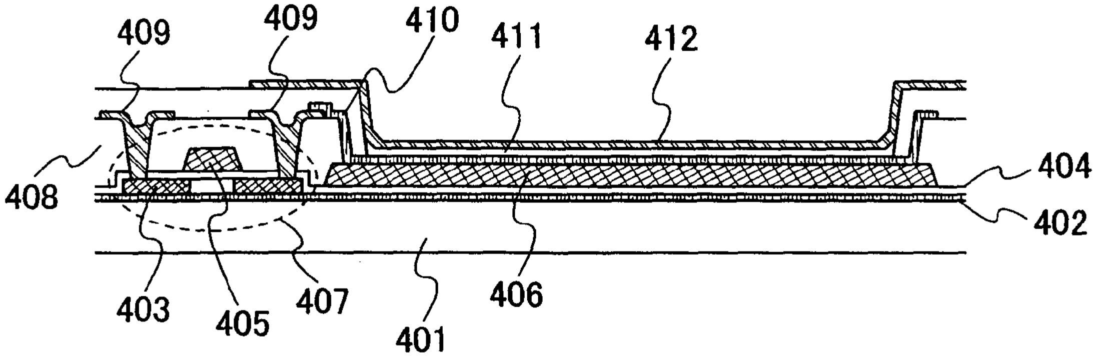
FIGS. 4A and 4B are views showing an embodiment (manufacturing process) of the present invention.
Figure 4B:
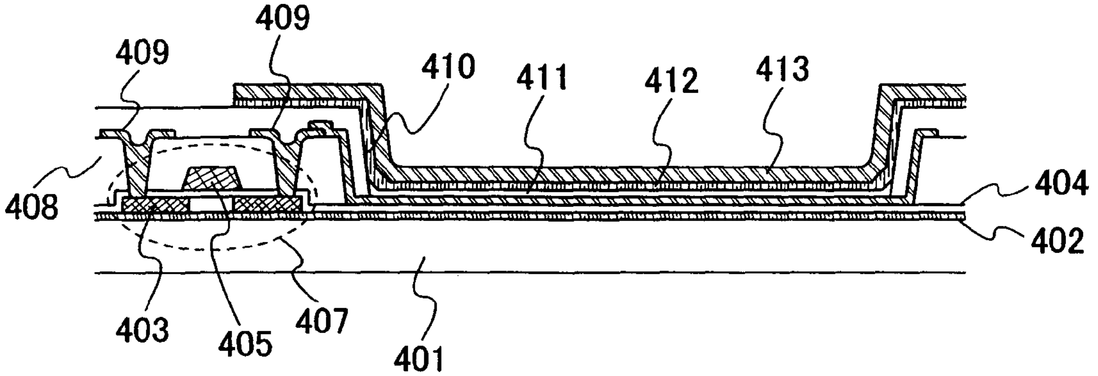

FIG. 4A shows a cross-sectional view of a bottom emission display device, and FIG. 4B shows a cross-sectional view of a top emission display device. The same reference numerals are used for the structures common to the two views. Hereinafter, the description will be made with reference to the two views.

As a substrate 401 having an insulating surface, a glass substrate, a quartz substrate, or the like can be used. A substrate formed of a synthetic resin having flexibility such as plastic typified by polyethylene terephthalate (PET) and polyethylene naphthalate (PEN) or acrylic may be used as long as it can resist the treatment temperatures in the manufacturing steps. It is to be noted that a stainless-steel substrate or the like may be used when manufacturing the top emission display device since a light-transmitting property is not required for the substrate 401.

First, a base film 402 is formed over the substrate 401. An insulating film such as silicon oxide, silicon nitride, or silicon nitride oxide can be used as the base film 402. Next, an amorphous semiconductor film is formed over the base film 402. The film thickness of the amorphous semiconductor film is 25 to 100 nm. Alternatively, not only silicon but also silicon germanium may be used for the amorphous semiconductor. Subsequently, the amorphous semiconductor film is crystallized if necessary, so as to form a crystalline semiconductor film. As a method for crystallization, a heating furnace, laser irradiation, irradiation of light emitted from a lamp, or a combination thereof can be used. For example, a metal element is added to the amorphous semiconductor film, and heat treatment using the heating furnace is performed; thereby forming the crystalline semiconductor film. By adding a metal element in this manner, crystallization can be achieved at low temperature, which is preferable.

It is to be noted that a TFT formed using a crystalline semiconductor has higher electron field-effect mobility and larger on-current than a TFT formed using an amorphous semiconductor; therefore, it is more suitable for a transistor used in a semiconductor device.

Next, the crystalline semiconductor film is patterned into a predetermined shape; thereby obtaining an island-shaped semiconductor film 403 to be an active layer of the TFT. Then, an insulating film 404 functioning as a gate insulating film is formed. The insulating film 404 is formed so as to cover the semiconductor film, with a thickness of 10 to 150 nm. For example, a silicon oxynitride film, a silicon oxide film, or the like can be used, and it may have a single-layer structure or a stacked structure.

Next, a conductive film 405 functioning as a gate electrode is formed over the gate insulating film. The gate electrode may a single layer or a stacked layer. The conductive film 405 is formed using an element selected from Ta, W, Ti, Mo, Al, and Cu, an alloy material or a compound material mainly containing these elements. In the bottom emission case, a light-blocking layer 406 for blocking light from a monitoring element is formed concurrently with the conductive film 405. In the top emission case, the light-blocking layer 406 is not particularly required, but it may be formed. However, it is not illustrated in FIG. 4B.

Next, an impurity element is added, using the gate electrode as a mask, to form an impurity region; thereby forming a TFT 407. At this time, a low concentration impurity region may be formed in addition to a high concentration impurity region. The low concentration impurity region is referred to as an LDD (lightly doped drain) region.

Next, an interlayer film 408 using an insulating film is formed. The interlayer film 408 is preferably formed using an organic material or an inorganic material. As the organic material, polyimide, acrylic, polyamide, polyimide-amide, benzocyclobutene, or siloxane can be used. Siloxane has a skeletal structure with a bond of silicon (Si) and oxygen (O). As a substituent, an organic group containing at least hydrogen (e.g., an alkyl group or aromatic hydrocarbon) is used. As the substituent, a fluoro group may also be used. Alternatively, a fluoro group and an organic group containing at least hydrogen may be used as the substituents. As the inorganic material, an insulating film containing oxygen or nitrogen, such as a silicon oxide (SiOx) film, a silicon nitride (SiNx) film, a silicon oxynitride (SiOxNy) (x>y; x and y are natural numbers) film, or a silicon nitride oxide (SiNxOy) (x>y; x and y are natural numbers) film can be used. It is to be noted that a film formed from an organic material has favorable flatness whereas the organic material absorbs moisture or oxygen. In order to prevent the absorption, an insulating film containing an inorganic material is preferably formed over the insulating film formed of an organic material.

It is preferable that the interlayer film 408 be formed with a certain degree of thickness, approximately 500 nm to 1 μm, in order to improve the flatness of the surface, here. Furthermore, the interlayer film 408 in the region overlapping the light-blocking layer 406 is removed later, and when the interlayer film 408 has a certain degree of thickness, there occurs an appropriate step between the region where the interlayer film 408 is formed and the region where the interlayer film 408 is removed. In this way, the structure in which the light emitting layer of the monitoring element is formed in the depressed portion can be preferably formed as shown in FIGS. 4A and 4B, and a light-blocking property of the light emitting element can be improved. Therefore, in addition to the above-described range, it is preferable that the interlayer film 408 be formed to be thicker than a stacked structure forming the light emitting element, that is, a stacked layer of the pixel electrode, the light emitting layer, and the counter electrode. However, when a step formed by the interlayer film 408 is large, it can cause breakage of a pixel electrode formed later. Therefore, the film thickness may be appropriately determined so as not to cause such a phenomenon.

Next, contact holes are formed in the interlayer film 408. Simultaneously, the interlayer film 408 in a region overlapping the light-blocking layer 406 is removed. In this region, a light emitting element is formed later. Also in the top emission case, the interlayer film 408 in the same portion is removed. After that, a conductive film 409 functioning as a source wiring and a drain wiring of the TFT 407 is formed. The conductive film 409 can be formed using an element selected from aluminum (Al), titanium (Ti), molybdenum (Mo), tungsten (W), and silicon (Si), or an alloy film containing any of these elements. In this embodiment mode, the conductive film 409 is formed of a stacked-layer film including a titanium film, a titanium nitride film, a titanium-aluminum alloy film, and a titanium film.

Next, a pixel electrode 410 is formed. The pixel electrode 410 is formed so as to partially overlap the conductive film 409 and electrical connection is made. Although not illustrated, an interlayer film may be formed after forming the conductive film 409, and after a contact hole is formed in a portion to make electrical connection with the conductive film 409, the pixel electrode 410 may be formed. The pixel electrode 410 is preferably formed using a conductive material such as metal, alloy, an electrically conductive compound, or a mixture thereof, each having a high work function (a work function of 4 eV or higher). As a specific example of the conductive material, indium oxide containing tungsten oxide (IWO), indium zinc oxide containing tungsten oxide (IWZO), indium oxide containing titanium oxide (ITiO), indium tin oxide containing titanium oxide (ITTiO), or the like can be given. Needless to say, indium tin oxide (ITO), indium zinc oxide (IZO), indium tin oxide with silicon oxide added (ITSO), or the like can also be used.

An example of composition ratio of the conductive material is described below. The composition ratio of indium oxide containing tungsten oxide may be tungsten oxide:indium oxide=1 wt %:99 wt %. The composition ratio of indium zinc oxide containing tungsten oxide may be tungsten oxide:zinc oxide:indium oxide=1 wt %:0.5 wt %:98.5 wt %. The composition ratio of indium oxide containing titanium oxide may be titanium oxide:indium oxide=1 to 5 wt %:99 to 95 wt %. The composition ratio of indium tin oxide (ITO) may be tin oxide:indium oxide=10 wt %:90 wt %. The composition ratio of indium zinc oxide (IZO) may be zinc oxide:indium oxide=11 wt %:89 wt %. The composition ratio of indium tin oxide containing titanium oxide may be titanium oxide:tin oxide:indium oxide=5 wt %:10 wt %:85 wt %. These composition ratios are just examples, and the composition ratio may be appropriately determined.

Although all the materials given as a preferable material for the pixel electrode 410 have a light-transmitting property, it is preferable that the pixel electrode 410 have reflectivity in the top emission case shown in FIG. 4B. Therefore, it is preferable that the pixel electrode 410 be formed by stacking another metal film and the above-described material having a high work function such that the above-described material having a high work function is on the top surface.

Next, a light emitting layer 411 is formed by an evaporation method or an ink jet method. The light emitting layer 411 is formed using an organic material or an inorganic material, and constituted by appropriately combining an electron-injecting layer (EIL), an electron-transporting layer (ETL), a light-emitting layer (EML), a hole-transporting layer (HTL), a hole-injecting layer (HIL), or the like. The boundary between the layers is not necessarily clear; in some cases, respective materials of the layers are partially mixed so that the interface is unclear.

The light emitting layer 411 is preferably constituted using a plurality of layers having different functions, such as a hole-injecting/transporting layer, a light-emitting layer, and an electron-injecting/transporting layer.

The hole-injecting/transporting layer is preferably formed of a composite material containing an organic compound material having a hole-transporting property and an inorganic compound material having an electron-receiving property with respect to the organic compound material. This structure generates a large number of hole carriers in an organic compound which originally has almost no inherent carriers, to provide an excellent hole-injecting/transporting property. Accordingly, the driving voltage can be lower than conventional driving voltage. Furthermore, since the hole-injecting/transporting layer can be made thick without increasing the driving voltage, a short circuit failure of the light emitting element caused by dust or the like can be reduced.

As an organic compound material having a hole-transporting property, for example, copper phthalocyanine (abbreviated to CuPc), vanadyl phthalocyanine (abbreviated to VOPc), 4,4',4"-tris(N,N-diphenylamino)triphenylamine (abbreviated to TDATA), 4,4',4"-tris[N-(3-methylphenyl)-N-phenylamino]triphenylamine (abbreviated to MTDATA), 1,3,5-tris[N,N-di(m-tolyl)amino]benzene (abbreviated to m-MTDAB), N,N'-diphenyl-N,N'-bis(3-methylphenyl)-1,1'-biphenyl-4,4'-diamine (abbreviated to TPD), 4,4'-bis[N-(1-naphthyl)-N-phenylamino]biphenyl (abbreviated to NPB), 4,4'-bis{N-[4-di(m-tolyl)amino]phenyl-N-phenylamino}biphenyl (abbreviated to DNTPD), 4,4',4"-tris(N-carbazolyl)triphenylamine (abbreviated to TCTA), or the like is given; the organic compound material is not limited to the above.

As the inorganic compound material having an electron-receiving property, titanium oxide, zirconium oxide, vanadium oxide, molybdenum oxide, tungsten oxide, rhenium oxide, ruthenium oxide, zinc oxide, or the like is given. In particular, vanadium oxide, molybdenum oxide, tungsten oxide, or rhenium oxide is preferable because it can be formed using vacuum evaporation and easily treated.

An electron-injecting/transporting layer is formed of an organic compound material having an electron-transporting property. Specifically, tris(8-quinolinolato) aluminum (abbreviated to Alq3), tris(4-methyl-8-quinolinolato)aluminum (abbreviated to Almq3), bis(10-hydroxybenzo[h]-quinolinato)beryllium (abbreviated to BeBq2), bis(2-methyl-8-quinolinolato)(4-phenylphenolato)aluminum (abbreviated to BAlq), bis[2-(2'-hydroxyphenyl)benzoxazolato]zinc (abbreviated to Zn(BOX)2), bis[2-(2'-hydroxyphenyl)benzothiazolato]zinc (abbreviated to Zn(BTZ)2), bathophenanthroline (abbreviated to BPhen), bathocuproin (abbreviated to BCP), 2-(4-biphenylyl)-5-(4-tert-butylphenyl)-1,3,4-oxadiazole (abbreviated to PBD), 1,3-bis[5-(4-tert-butylphenyl)-1,3,4-oxadiazole-2-yl]benzene (abbreviated to OXD-7), 2,2',2"-(1,3,5-benzenetriyl)-tris(1-phenyl-1H-benzoimidazole) (abbreviated to TPBI), 3-(4-biphenylyl)-4-phenyl-5-(4-tert-butylphenyl)-1,2,4-triazole (abbreviated to TAZ), 3-(4-biphenylyl)-4-(4-ethylphenyl)-5-(4-tert-butylphenyl)-1,2,4-triazole (abbreviated to p-EtTAZ), or the like is given; the organic compound material is not limited to the above.

As the light-emitting layer, the following can be given as an example: 9,10-di(2-naphthyl)anthracene (abbreviated to DNA), 9,10-di(2-naphthyl)-2-tert-butylanthracene (abbreviated to t-BuDNA), 4,4'-bis(2,2-diphenylvinyl)biphenyl (abbreviated to DPVBi), coumarin 30, coumarin 6, coumarin 545, coumarin 545T, perylene, rubrene, periflanthene, 2,5,8,11-tetra(tert-butyl)perylene (abbreviated to TBP), 9,10-diphenylanthracene (abbreviated to DPA), 5,12-diphenyltetracene, 4-(dicyanomethylene)-2-methyl-[p-(dimethylamino)styryl]-4H-pyran (abbreviated to DCM1), 4-(dicyanomethylene)-2-methyl-6-[2-(joulolidine-9-yl)ethenyl]-4H-pyran (abbreviated to DCM2), 4-(dicyanomethylene)-2,6-bis[p-(dimethylamino)styryl]-4H-pyran (abbreviated to BisDCM), or the like. In addition, the following compound capable of emitting phosphorescence can also be used: bis[2-(4',6'-difluorophenyl)pyridinato-N,C2']iridium (picolinate) (abbreviated to FIrpic), bis{2-[3',5'-bis(trifluoromethyl)phenyl]pyridinato-N,C2'}iridium(picolinate) (abbreviated to Ir(CF3ppy)2(pic)), tris(2-phenylpyridinato-N,C2')iridium (abbreviated to Ir(ppy)3), bis(2-phenylpyridinato-N,C2')iridium(acetylacetonate) (abbreviated to Ir(ppy)2(acac)), bis[2-(2'-thienyl)pyridinato-N,C3']iridium(acetylacetonate) (abbreviated to Ir(thp)2 (acac)), bis(2-phenylquinolinato-N,C2')iridium(acetylacetonate) (abbreviated to Ir(pq)2(acac)), bis[2-(2'-benzothienyl)pyridinato-N,C3']iridium(acetylacetonate) (abbreviated to $Ir(btp)_2(acac)$), or the like.

The light-emitting layer may use a singlet excited light-emitting material and a triplet excited material including a metal complex or the like. For example, among a red light-emitting pixel, a green light-emitting pixel, and a blue light-emitting pixel, the red light-emitting pixel of which luminance half-reduced period is relatively short is formed of a triplet-excited light-emitting material and the others are formed of a singlet-excited light-emitting material. Because of high luminous efficiency, power consumption of a triplet-excited light-emitting material is less than that of a singlet-excited light-emitting material to obtain the same luminance. That is, if the red light-emitting pixel is formed of a triplet-excited light-emitting material, reliability thereof can be improved because the amount of current flowing into the light-emitting element of the red light-emitting pixel is small. In order to reduce the power consumption, the red light-emitting pixel and the green light-emitting pixel may be formed of a triplet-excited light-emitting material and the blue light-emitting pixel may be formed of a singlet-excited light-emitting material. By forming the green light-emitting element, which has high visibility to human eyes, of a triplet-excited light-emitting material, further reduction in power consumption can be achieved.

The light-emitting layer may have a structure for performing color display by forming a light emitting layer with a different light emission wavelength band for each pixel. Typically, light-emitting layers each corresponding to each color of R (red), G (green), and B (blue) are formed. Even in this case, by providing a filter for passing light with the light emission wavelength band, on a light emission side of the pixel, color purity can be increased and reflection (glare) of the pixel portion can be prevented. By providing the filter, it is possible to omit a circular polarizing plate or the like which has been conventionally required and to avoid loss of light emitted from the light emitting layer. Moreover, a change of color tone which occurs when the pixel portion (display screen) is viewed obliquely can be decreased.

In addition, as an electroluminescent material applicable to the light emitting layer, a high molecular weight material such as a polyparaphenylenevinylene-based material, a polyparaphenylene-based material, a polythiophene-based material, a polyfluorene-based material, or the like is given.

Alternatively, an inorganic material may be used for the light emitting layer. As the inorganic material, a compound semiconductor such as zinc sulfide (ZnS) added with an impurity such as manganese (Mn) or a rare earth (Eu, Ce, or the like) may be used. Such impurities are referred to as luminescent center ions, and light emission is obtained due to electron transition in the ion. Furthermore, the compound semiconductor such as zinc sulfide (ZnS) may be added with an acceptor element such as Cu, Ag, or Au and a donor element such as F, Cl, or Br so that light emission is obtained due to transition between acceptors and donors. Furthermore, GaAs may be added in order to improve the light emission efficiency. The light emitting layer may be provided with a thickness of 100 to 1000 nm (preferably 300 to 600 nm). A dielectric layer is interposed between such a light emitting layer and an electrode (anode and cathode) in order to improve the light emission efficiency. As the dielectric layer, barium titanate ($BaTiO_3$) or the like may be used. The dielectric layer is provided with a thickness of 50 to 500 nm (preferably 100 to 200 nm).

In any event, the layer structure of the light emitting layer can be modified. Within the scope for achieving the purpose as the light emitting element, such modification is allowable that a predetermined hole or electron injecting/transporting layer or a light-emitting layer is replaced with an electrode layer having the same purpose or a light-emitting material being diffused is provided.

Moreover, a color filter (colored layer) may be formed over a sealing substrate. The color filter (colored layer) can be formed by an evaporation method or a droplet discharging method. By using the color filter (colored layer), high-definition display can also be carried out because the color filter (colored layer) can correct a broad peak in a light-emission spectrum of each color of RGB so as to be a sharp peak.

Further, full-color display can be achieved by forming a material of emitting a single color and combining the material with a color filter or a color conversion layer. The color filter (colored layer) or the color conversion layer may be formed over, for example, a second substrate (a sealing substrate) and attached to the substrate.

Then, a counter electrode 412 is formed by a sputtering method or an evaporation method. One of the pixel electrode 410 or the counter electrode 412 functions as an anode while the other functions as a cathode.

As a cathode material, it is preferable to use metal, alloy, an electrically conductive compound, a mixture thereof, or the like each having a low work function (a work function of 3.8 eV or lower). As a specific example of the cathode material, an element belonging to Group 1 or 2 in the periodic table, i.e., alkali metal such as Li or Cs, alkaline earth metal such as Mg, Ca, or Sr, alloy containing the above metal (Mg:Ag or Al:Li), a compound containing the above metal (LiF, CsF, or $CaF_2$), or transition metal containing rare-earth metal can be used. In the top emission case, the counter electrode should have a light-transmitting property. Therefore, when the counter electrode is used as the cathode, it is preferable that the above metal or alloy containing the metal be formed as an extremely thin film, and another metal (including alloy) such as ITO be stacked thereover.

Furthermore, in the top emission case, the counter electrode 412 in the monitoring element should function as a light-blocking layer as well. Therefore, in addition to the above-described structure, a conductive film 413 formed using a material having a light-blocking property may be formed and stacked thereover. In this case, the conductive film 413 is selectively formed in the desired region so as not to be formed over the counter electrode of the pixel portion, because light emission should be extracted in the pixel portion.

After that, a protective film such as a silicon nitride film or a DLC (Diamond Like Carbon) film (not illustrated in FIGS. 4A and 4B) may be provided so as to cover the counter electrode 412. Through the above steps, the light emitting device of the present invention is completed.

This embodiment can be freely combined with the embodiment modes and other embodiments.

EMBODIMENT 2

In this embodiment, a method in which a potential of a current supply line is corrected and the influence of fluctuation in the current value of a light emitting element due to a change in the environmental temperature and a temporal change can be controlled will be described.

A light emitting element has a characteristic that its resistance value (internal resistance value) changes due to the surrounding temperature. Specifically, assuming that room temperature is a normal temperature, the resistance value decreases when the temperature becomes higher than normal, and the resistance value increases when the temperature becomes lower than normal. Therefore, in the case where the same voltage is applied to a light emitting element, when the temperature rises, the current value increases and luminance becomes higher than desired, and when the temperature drops, the current value decreases and luminance becomes lower than desired. In addition, a light emitting element has a characteristic that its current value decreases with time. Specifically, as the light emitting time and the non-light-emitting time accumulate, the resistance value increases following deterioration of the light emitting element. Therefore, as the light emitting time and the non-light-emitting time accumulate, the current value decreases even when the same voltage is applied to the light emitting element, and the luminance is lower than desired.

Due to the above-described characteristics of a light emitting element, the luminance fluctuates when the environmental temperature changes or when a temporal change occurs. This embodiment can control the influence of fluctuation in the current value of a light emitting element due to a change in the environmental temperature and a temporal change by correcting a potential of the current supply line of the present invention.

Figure 5:
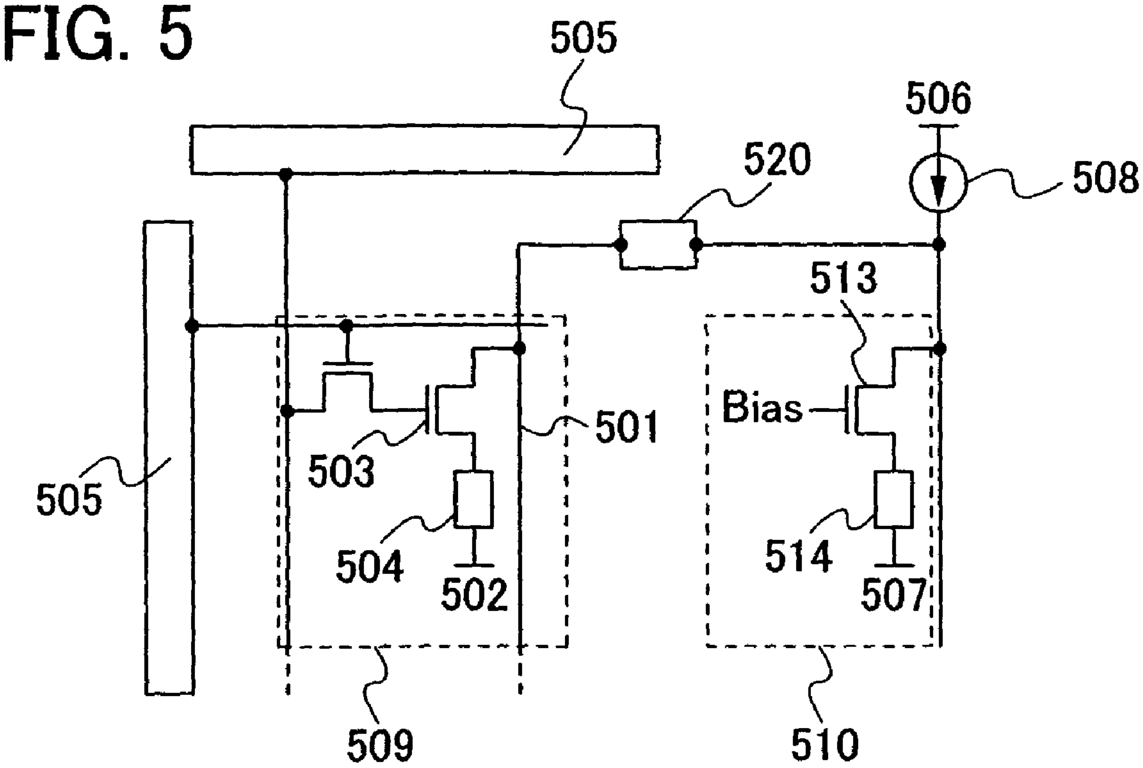
FIG. 5 is a diagram showing an embodiment (correction means using a monitoring element) of the present invention.

FIG. 5 shows a circuit configuration. In FIG. 5, a driving TFT 503 and a light emitting element 504 are connected between a current supply line 501 and a counter electrode 502. The control of the driving TFT 503 is performed by a signal from peripheral circuits 505. When the driving TFT 503 is turned on, a current flows from the current supply line 501 toward the counter electrode 502. The luminance of the light emitting element 504 is determined depending on the value of a current flowing there. In addition, there are a case where the value of a current flowing to the light emitting element is controlled by the driving TFT 503 and a case where the driving TFT 503 is used just as a switch and the current value is controlled by a voltage between the current supply line 501 and the counter electrode 502.

In the case of the latter structure, when a potential of the current supply line 501 and a potential of the counter electrode 502 are fixed, the value of a current flowing to the light emitting element changes when the resistance value of the light emitting element changes due to the above-described changes in the properties of the light emitting element. Accordingly, the luminance changes.

Therefore, the influence of the changes in the properties as described above is corrected by using a correction circuit. In this embodiment, changes due to the deterioration of the light emitting element 504 and temperature are corrected by adjusting a potential of the current supply line 501.

First, the structure of the correction circuit will be described. A current source 508 for monitoring and a monitoring element portion 510 are connected between a first monitoring power line 506 and a second monitoring power line 507. The monitoring element portion 510 includes a driving TFT 513 and a monitoring element 514 which is a light emitting element. The driving TFT 513 is not particularly required, but it is placed so as to keep the behavior of the light emitting element 504 included in a pixel portion 509 and the behavior of the monitoring element 514 the same as much as possible. The same bias voltage as an on-voltage of the driving TFT 503 in the pixel portion 509 is applied to a gate electrode of the driving TFT 513. An input terminal of a sampling circuit 520 for outputting a potential of an anode of the monitoring element 514 is connected to the contact point between the monitoring element portion 510 and the current supply 508 for monitoring. The current supply line 501 is connected to an output terminal of the sampling circuit 520. Accordingly, a potential of the current supply line 501 is controlled by an output of the sampling circuit 520. It is to be noted that the structure of the pixel portion 509 indicated by a dotted frame corresponds to the dotted frame 11 shown in FIG. 1, and the structure of the monitoring element portion 510 indicated by a dotted frame corresponds to the dotted frame 10 shown in FIG. 1.

Next, operation of the correction circuit will be described. First, the current source 508 for monitoring allows a current to flow the amount which makes the light emitting element 504 emit light with the highest gray scale level. This current value is set to be Ipix. At this time, a potential of the counter electrode 502 in the pixel portion 509 and a potential of the second monitoring power line 507 are equal to each other.

Then, as the voltage between the both electrodes in the monitoring element 514, voltages required for letting a current with the amount Ipix flow is generated naturally. Even when the volt-ampere characteristic of the monitoring element 514 is changed due to the deterioration and temperature, the voltage between the both electrodes of the monitoring element 514 changes accordingly so as to be appropriate voltages. In this manner, the influence of the changes in the properties of the monitoring element 514 can be corrected.

A potential in accordance with a voltage applied to the both electrodes in the monitoring element 514 is input to the input terminal of the sampling circuit 520. The sampling circuit 520 controls a potential of the output terminal, that is, a potential of the current supply line 501, so as to be equal to the potential input to the input terminal. Therefore, the output terminal of the sampling circuit 520, that is, the potential of the current supply line 501, is corrected by the correction circuit in accordance with the potential determined by the monitoring element 514, and the changes in the properties of the light emitting element 504, which is in the pixel portion 509 surrounded by the dotted frame, due to the deterioration and temperature are corrected.

It is to be noted that any circuit can be used as the sampling circuit 520, as long as the circuit outputs a voltage in accordance with an input current. For example, a voltage follower circuit is a kind of an amplifier circuit, but the sampling circuit is not limited thereto. The circuit may be structured using any of an operational amplifier, a bipolar transistor, a MOS transistor, or a combination of a plurality of them.

It is to be noted that the monitoring element portion 510 is preferably formed simultaneously with the pixel portion 509 surrounded by the dotted frame, by the same manufacturing method, and over the same substrate. This is because, if the property of the pixel for monitoring and the property of the pixel placed in the pixel portion differ from each other, their corrections should be different from each other as well.

It is to be noted that a current does not constantly flow to the light emitting element 504 placed in the pixel portion 509 surrounded by the dotted frame, and there coexist a period in which a current flows and a period in which no current flows, depending on an image to be displayed. Therefore, if a current is applied to the monitoring element 514 constantly, deterioration of the monitoring element 514 included in the monitoring element portion 510 becomes faster. Accordingly, excessive correction is made for a potential output from the sampling circuit 520. Then, the deterioration rate of the monitoring element may be made to conform to the deterioration rate of the actual pixels. For example, when lighting ratio of the whole screen is 30% averagely, a current may be applied to the monitoring element 514 only for a period that corresponds to the luminance of 30%. When doing so, there occurs a period in which a current does not flow to the monitoring element 514 and a potential of an input terminal of the sampling circuit 520 changes, but a voltage should be supplied from the output terminal of the sampling circuit 520 constantly. In order to realize this, a retention mechanism may be provided for the sampling circuit 520 so as to maintain the potential which is obtained when a current is applied to the monitoring element 514.

When the monitoring element portion 510 is operated conforming to the brightest gray scale level, a potential to which a slightly strong correction is made is output. However, because of this, burn-in in the pixels (uneven luminance due to changes in deterioration rate of each pixel) becomes unnoticeable. Therefore, it is preferable that the monitoring element portion 510 be operated conforming to the highest gray scale level.

In this embodiment, it is further preferable that the driving TFT 503 be operated in a linear region. Operated in a linear region, the driving TFT 503 operates generally as a switch. In this way, the characteristic variation and changes in the properties caused by temperature, deterioration, or the like of the driving TFT 503 can be prevented from easily affecting the value of a current flowing to the light emitting element. When the driving TFT 503 is operated only in a linear region, whether a current flows or not to the light emitting element 504 is often controlled digitally. In this case, it is preferable that a time gray scale or an area gray scale method be used in combination for increasing the number of gray scales.

This embodiment can be freely combined with the above-described embodiment modes and other embodiments.

EMBODIMENT 3

As electronic devices equipped with the display device of the present invention, a television receiver, a video camera, a digital camera, a goggle type display, a navigation system, a sound reproducing device (such as a car audio component), a computer, a game machine, a mobile information terminal (such as a mobile computer, a mobile phone, a mobile game machine, or an electronic book), an image reproducing device equipped with a recording medium (specifically, a device for reproducing a recording medium such as DVD (digital versatile disk), which is equipped with a display for displaying the reproduced image), or the like is given. Specific examples of the electronic devices are shown in FIGS. 6, 7, 8A, 8B, 9A, 9B, 10, and 11A to 11E.

Figure 6:
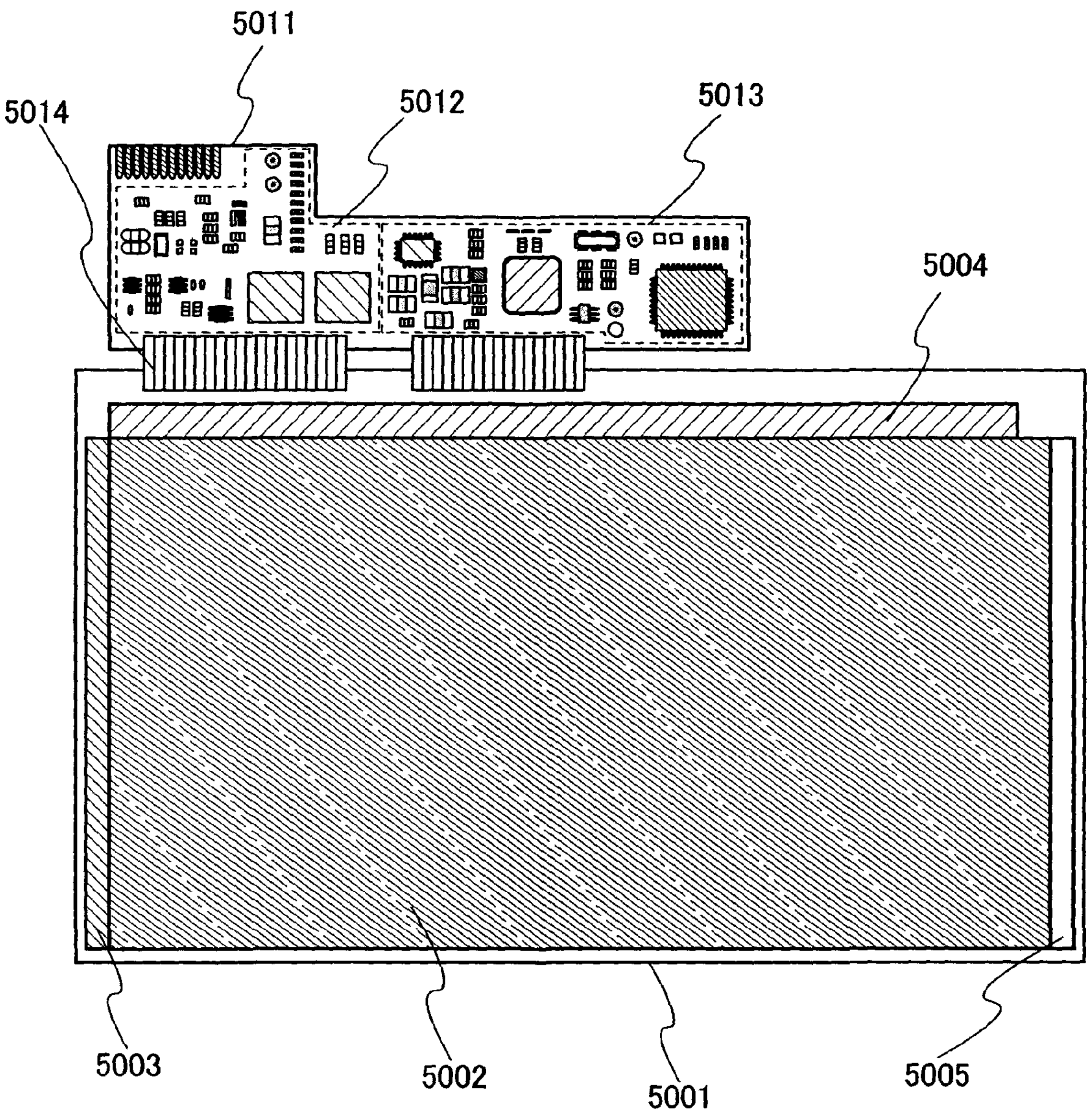
FIG. 6 is a view showing a structure example of an electronic device to which a display device of the present invention can be applied.

FIG. 6 shows a TV module in which a display panel 5001 and a circuit substrate 5011 are combined. Over the circuit substrate 5011, a control circuit 5012, a signal dividing circuit 5013, a correction circuit, and the like are formed, and the display panel 5001 and the circuit substrate 5011 are electrically connected to each other with a connection wire 5014.

This display panel 5001 is provided with a pixel portion 5002 in which a plurality of pixels are provided, a monitoring element portion 5005, a scan line driver circuit 5003, and a signal line driver circuit 5004 for supplying a video signal to the selected pixel. In the case of manufacturing a module, a display device in which a pixel in the pixel portion 5002 is constituted using the above embodiment may be manufactured. Furthermore, function circuits including the scan line driver circuit 5003 can be manufactured using TFTs formed by the above embodiment, or may be provided as external circuits.

Figure 7:
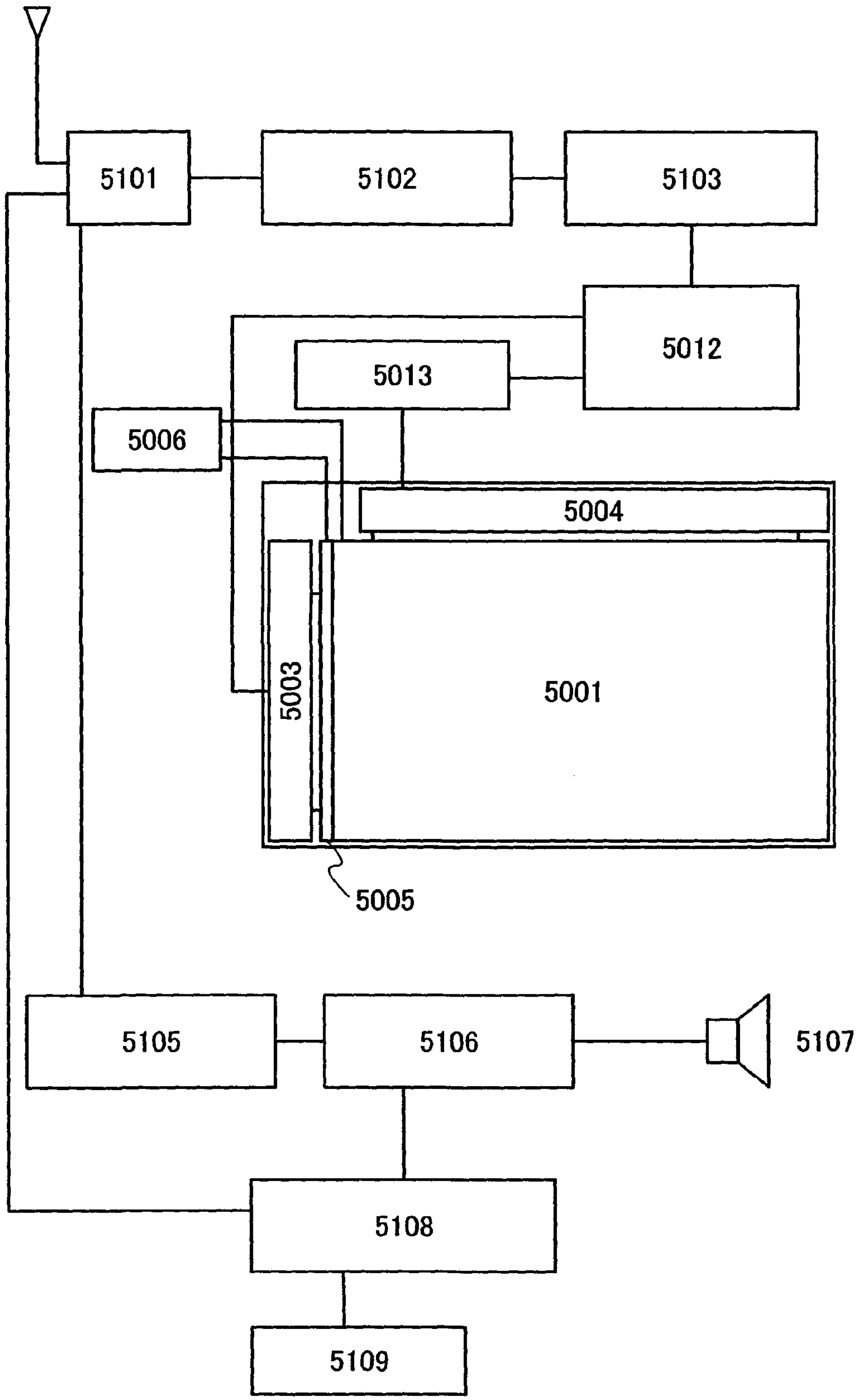
FIG. 7 is a view showing a structure example of an electronic device to which a display device of the present invention can be applied.

FIG. 7 is a block diagram showing a main constitution of the TV module shown in FIG. 6. A video signal and an audio signal are received with a tuner 5101. The video signal is processed by a video signal amplifying circuit 5102, a video signal processing circuit 5103 for converting a signal output from the video signal amplifying circuit 5102 into a color signal corresponding to red, green, or blue, and a control circuit 5012 for converting the video signal in accordance with an input specification of a driver IC. The control circuit 5012 outputs signals to peripheral circuits for driving a scan line and a signal line respectively. In the case of digital driving, the signal dividing circuit 5013 may be provided on the signal line side, so that the input digital signal may be divided into a plurality of signals to supply.

Among the signals received with the tuner 5101, an audio signal is sent to an audio signal amplifying circuit 5105 and output to a speaker 5107 through an audio signal processing circuit 5106. A control circuit 5108 receives control information of a receiving station (a receiving frequency) or volume from an input portion 5109 and sends a signal to the tuner 5101 or the audio signal processing circuit 5106.

The correction circuit 5006 controls a potential of a current supply line for driving the light emitting element in the pixel portion, in accordance with changes in the properties of the monitoring element portion provided near the pixel portion of the display panel 5001.

Figure 8A:
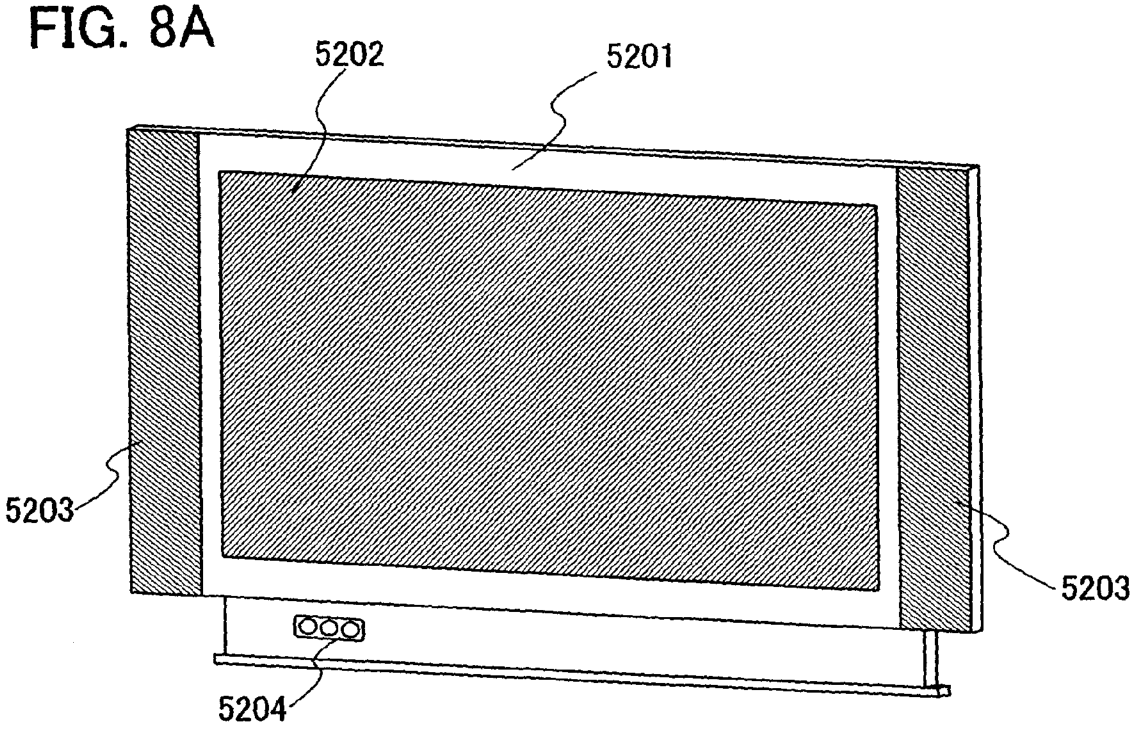
FIGS. 8A and 8B are views each showing a structure example of an electronic device to which a display device of the present invention can be applied.

As shown in FIG. 8A, a television receiver can be completed by incorporating a TV module in a housing 5201. With the TV module, a display screen 5202 is formed. Furthermore, a speaker 5203, an operation switch 5204, and the like are appropriately provided.

Figure 8B:
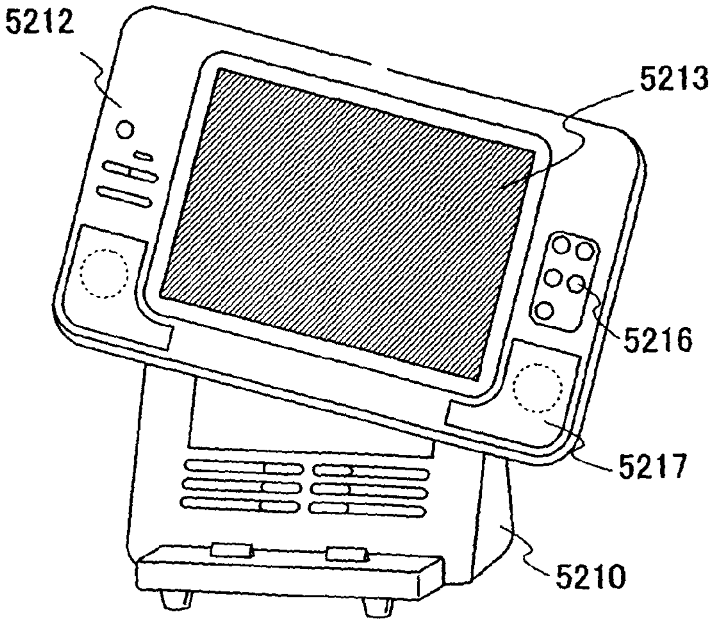

FIG. 8B shows a television receiver of which a display is wirelessly portable by itself. A housing 5212 incorporates a battery and a signal receiver, and a display portion 5213 and a speaker portion 5217 are driven with the battery. The battery can be repeatedly charged with a battery charger 5210. The battery charger 5210 can send and receive a video signal and can send the video signal to the signal receiver in the display. The housing 5212 is controlled by an operation key 5216. Since the appliance shown in FIG. 8B can send a signal from the housing 5212 to the battery charger 5210 by operation of the operation key 5216, the appliance can also be referred to as a two-way video/audio communication device. Moreover, by operation of the operation key 5216, a signal can be sent from the housing 5212 to the battery charger 5210 and the signal can be further sent from the battery charger 5210 to another electronic device, so that communication control of the another electronic device is also possible. Therefore, it is also referred to as a general-purpose remote control device. The present invention can be applied to the display portion 5213.

When the display device of the present invention is used in the television receiver shown in FIGS. 6, 7, 8A and 8B, favorable display without luminance unevenness can be realized even in the case where changes in the properties occur in the light emitting element included in the pixel portion due to the deterioration and temperature change, by correcting a potential of the current supply line by the correction circuit.

Needless to say, the present invention is not limited to the television receiver, and the present invention can be applied for various purposes, such as monitors of personal computers, particularly, large display media like information displaying boards at railway stations or airports, or advertisement display boards on streets.

Figure 9A:
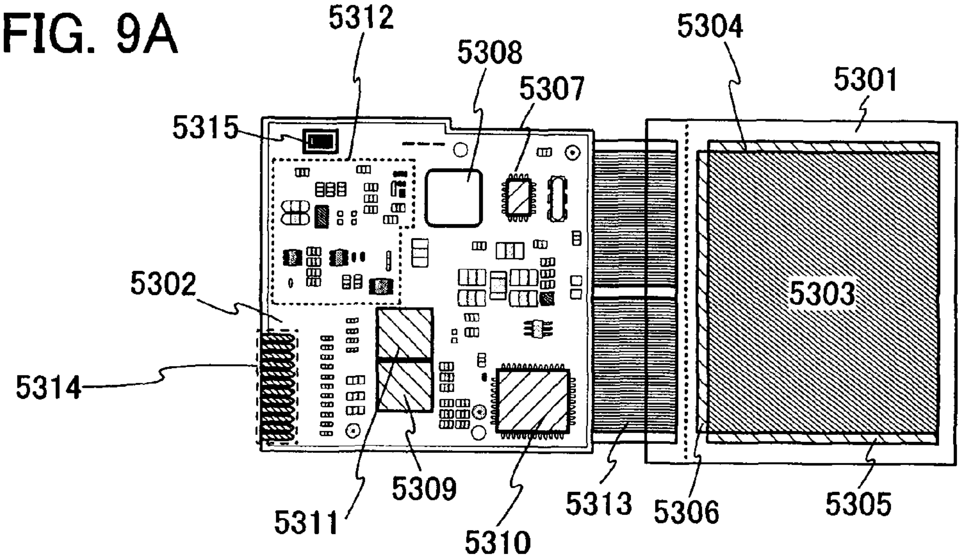
FIGS. 9A and 9B are views each showing a structure example of an electronic device to which a display device of the present invention can be applied.

FIG. 9A shows a module in which a display panel 5301 and a printed circuit board 5302 are combined. The display panel 5301 is provided with a pixel portion 5303 in which a plurality of pixels are provided, a monitoring element portion 5305, a first scan line driver circuit 5304, and a signal line driver circuit 5306.

The printed circuit board 5302 is provided with a controller 5307, a central processing unit (CPU) 5308, a memory 5309, a power source circuit 5310, a correction circuit 5329, an audio processing circuit 5311, a sending/receiving circuit 5312, and the like. The printed circuit board 5302 and the display panel 5301 are connected to each other by a flexible printed circuit board (FPC) 5313. The printed circuit board 5302 may be provided with a capacitor, a buffer circuit, or the like so that noise on a power source voltage or a signal, or a delay of the signal rise time can be prevented. Moreover, the controller 5307, the audio processing circuit 5311, the memory 5309, the CPU 5308, the power source circuit 5310, the correction circuit 5329, and the like can be mounted on the display panel 5301 by a COG (Chip On Glass) method. By the COG method, the size of the printed circuit board 5302 can be reduced.

Various control signals are input/output through an interface portion (I/F) 5314 provided for the printed circuit board 5302. Moreover, an antenna port 5315 for sending/receiving a signal to/from the antenna is provided for the printed circuit board 5302.

Figure 9B:
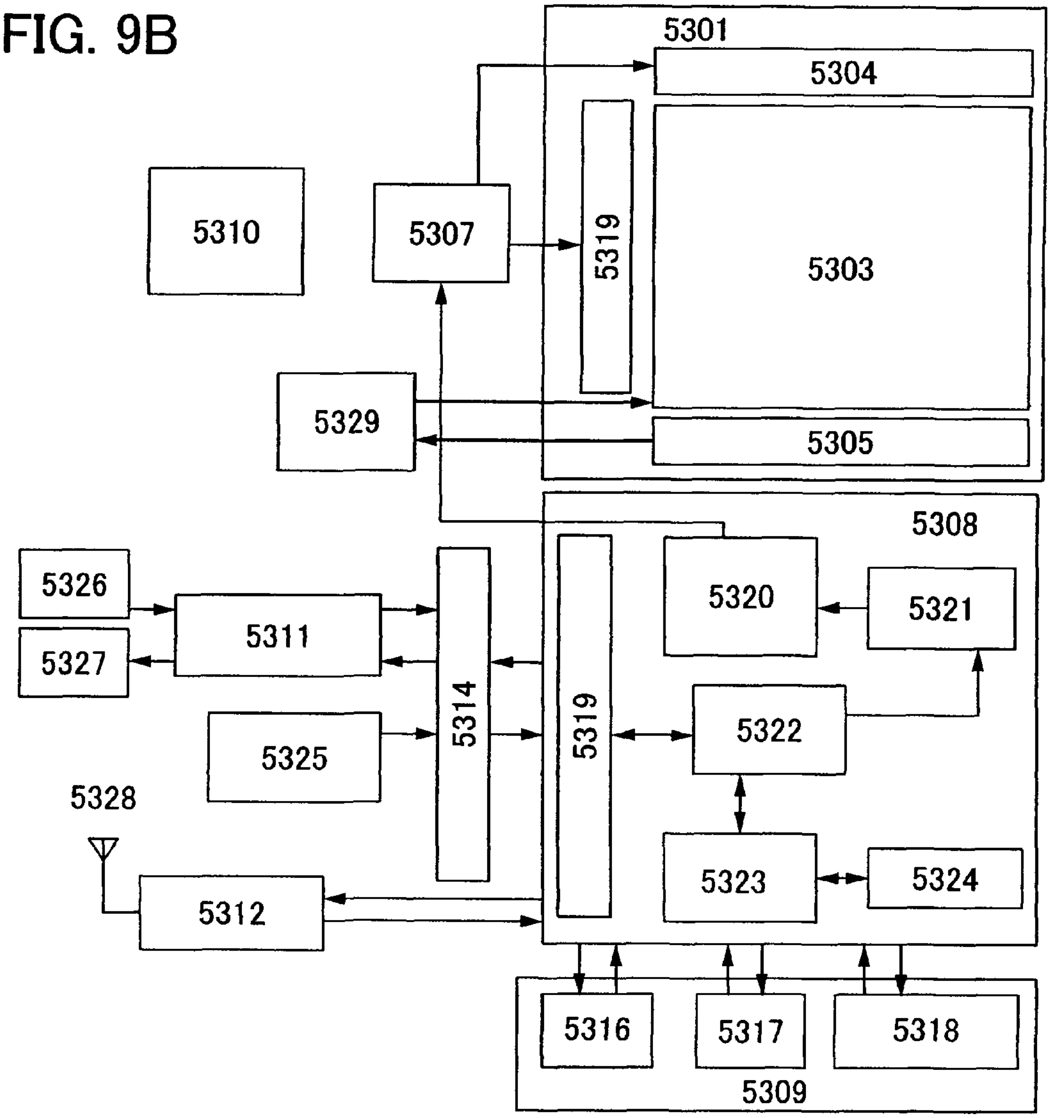

FIG. 9B is a block diagram of the module shown in FIG. 9A. This module includes a VRAM 5316, a DRAM 5317, a flash memory 5318, or the like as the memory 5309. The VRAM 5316 stores image data to be displayed on the panel, the DRAM 5317 stores image data or audio data, and the flash memory stores various programs.

The power source circuit 5310 supplies the electric power for operating the display panel 5301, the controller 5307, the CPU 5308, the audio processing circuit 5311, the memory 5309, and the sending/receiving circuit 5312. The power source circuit 5310 may be provided with a current source depending on the specification of the panel.

The CPU 5308 includes a control signal generating circuit 5320, a decoder 5321, a register 5322, an arithmetic circuit 5323, a RAM 5324, an interface 5319 for the CPU 5308, and the like. Various signals input to the CPU 5308 through the interface 5319 are input to the arithmetic circuit 5323, the decoder 5321, and the like after being held in the register 5322 once. The arithmetic circuit 5323 performs operation based on the input signal and specifies an address to send various instructions to. Meanwhile, the signal input to the decoder 5321 is decoded and input to the control signal generating circuit 5320. The control signal generating circuit 5320 generates a signal including various instructions based on the input signal and sends the signal to the address specified by the arithmetic circuit 5323, specifically to the memory 5309, the sending/receiving circuit 5312, the audio processing circuit 5311, the controller 5307, or the like.

The memory 5309, the sending/receiving circuit 5312, the audio processing circuit 5311, and the controller 5307 operate in accordance with the received instructions. Hereinafter the operation will be briefly described.

A signal input from an inputting means 5325 is sent to the CPU 5308 mounted on the printed circuit board 5302 through the interface portion 5314. The control signal generating circuit 5320 converts image data stored in the VRAM 5316 into a predetermined format in accordance with the signal sent from the inputting means 5325 such as a pointing device or a keyboard and sends the converted image data to the controller 5307.

The controller 5307 performs data processing to the signal including the image data which has been sent from the CPU 5308, in accordance with the specification of the panel and supplies the signal to the display panel 5301. The controller 5307 generates a Hsync signal, a Vsync signal, a clock signal CLK, an alternating voltage (AC Cont), and a switching signal L/R based on the power source voltage input from the power source circuit 5310 and the various signals input from the CPU 5308, and supplies these signals to the display panel 5301.

The sending/receiving circuit 5312 processes a signal which is sent/received as an electric wave with an antenna

5328 and specifically includes a high-frequency circuit such as an isolator, a bandpass filter, a VCO (Voltage Controlled Oscillator), an LPF (Low Pass Filter), a coupler, or a balun. Among the signals sent to or received from the sending/receiving circuit 5312, a signal including audio information is sent to the audio processing circuit 5311 in accordance with the instruction from the CPU 5308.

The signal including audio information which has been sent in accordance with the instruction of the CPU 5308 is demodulated into an audio signal in the audio processing circuit 5311 and sent to a speaker 5327. An audio signal which has been sent from a microphone 5326 is modulated in the audio processing circuit 5311 and sent to the sending/receiving circuit 5312 in accordance with an instruction from the CPU 5308.

The controller 5307, the CPU 5308, the power source circuit 5310, the audio processing circuit 5311, and the memory 5309 can be mounted as a package in this embodiment. This embodiment can be applied to any circuit other than a high-frequency circuit such as an isolator, a bandpass filter, a VCO (Voltage Controlled Oscillator), an LPF (Low Pass Filter), a coupler, or a balun.

Figure 10:
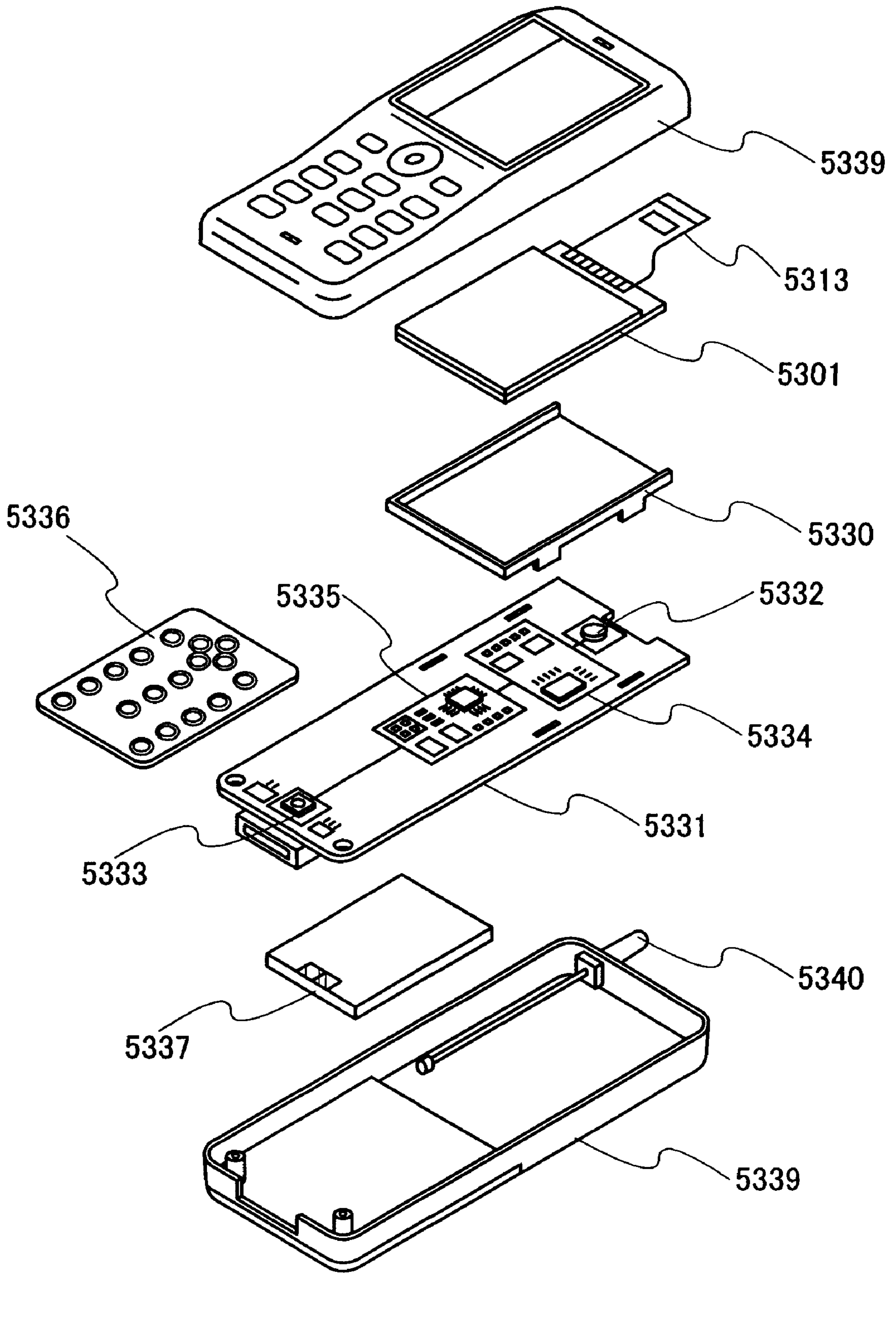
FIG. 10 is a view showing a structure example of an electronic device to which a display device of the present invention can be applied.

FIG. 10 shows one mode of a mobile phone including the module shown in FIGS. 9A and 9B. The display panel 5301 is detachably incorporated in a housing 5330. The housing 5330 can have any shape and size in accordance with the size of the display panel 5301. The housing 5330 with the display panel 5301 fixed thereto is fitted into a printed substrate 5331 and assembled as a module.

The display panel 5301 is connected to the printed substrate 5331 through the flexible printed circuit board 5313. The printed substrate 5331 is provided with a speaker 5332, a microphone 5333, a sending/receiving circuit 5334, and a signal processing circuit 5335 including a CPU, a controller, and the like. Such a module is combined with an inputting means 5336, a battery 5337, and an antenna 5340 and placed in a housing 5339. A pixel portion of the display panel 5301 is provided so as to be seen from an opening window formed in the housing 5339.

The mobile phone of this embodiment can be changed into various modes in accordance with function and intended purpose thereof. For example, a plurality of display panels may be provided, or the housing may be divided into a plurality of pieces appropriately and may be connected with a hinge so as to open and close.

The mobile phone shown in FIG. 10 has a structure in which semiconductor devices similar to that described in Embodiment Mode 1 are arranged in a matrix in the display panel 5301. In the semiconductor device, the on and off potential to be applied to a gate electrode of the driving transistor and the potential of amplitude of a data line in the pixel can be separately set. Therefore, the amplitude of the data line can be set low and power consumption of the semiconductor device can be drastically suppressed. Since the display panel 5301 including the semiconductor device has a similar characteristic, drastic reduction of power consumption is achieved in the mobile phone. According to such characteristics, the power source circuit can be drastically reduced or scaled down, and the smaller and lighter-weight housing 5339 can be achieved. The mobile phone of the present invention, in which low power consumption and reduction in size and weight are achieved, can be provided to customers as a product with improved portability.

Figure 11A:
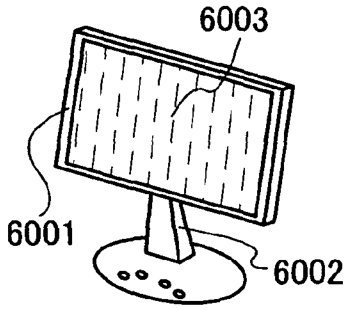
FIGS. 11A to 11E are views each showing a structure example of an electronic device to which a display device of the present invention can be applied.

FIG. 11A shows a television device which includes a housing 6001, a support base 6002, a display portion 6003, and the like. In this television device, the display portion 6003 is structured using the same display device as the one described in Embodiment Mode 1. A feature of this display device is that uniform display without luminance unevenness can be provided by correction of a potential of a power source that drives a light emitting element, in accordance with changes in the properties of the light emitting element associated with a change in the ambient temperature depending on the usage environment, passage of operating time, or the like. Because of this feature, a television device realizing the sufficient life cycle and capable of adapting to various usage environments can be provided to customers.

Figure 11B:
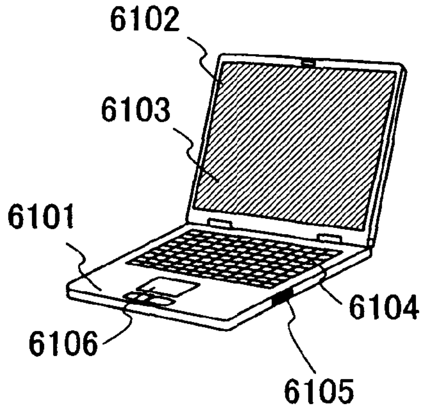

FIG. 11B shows a computer which includes a main body 6101, a housing 6102, a display portion 6103, a keyboard 6104, an external connection port 6105, a pointing mouse 6106, and the like. In this computer, the display portion 6103 is structured using the same display device as the one described in Embodiment Mode 1. A feature of this display device is that uniform display without luminance unevenness can be provided by correction of a potential of a power source that drives a light emitting element, in accordance with changes in the properties of the light emitting element associated with a change in the ambient temperature depending on the usage environment, passage of operating time, or the like. Because of this feature, a computer of the present invention realizing high picture quality that meets end user's demands and the sufficient life cycle, and capable of adapting to various usage environments can be provided to customers.

Figure 11C:
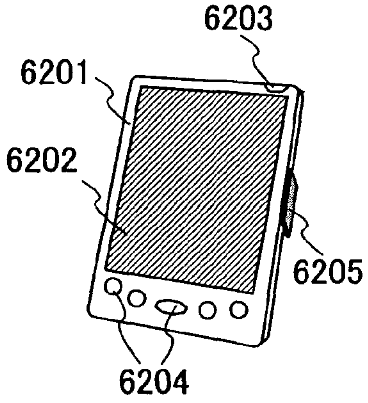

FIG. 11C shows a mobile computer which includes a main body 6201, a display portion 6202, a switch 6203, operation keys 6204, an infrared port 6205, and the like. In this mobile computer, the display portion 6202 is structured using the same display device as the one described in Embodiment Mode 1. A feature of this display device is that uniform display without luminance unevenness can be provided by correction of a potential of a power source that drives a light emitting element, in accordance with changes in the properties of the light emitting element associated with a change in the ambient temperature depending on the usage environment, passage of operating time, or the like. Because of this feature, a mobile computer realizing the sufficient life cycle and capable of adapting to various usage environments can be provided to customers.

Figure 11D:
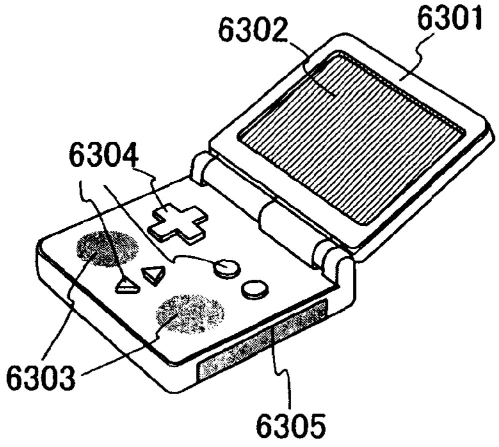

FIG. 11D shows a mobile game machine which includes a housing 6301, a display portion 6302, speaker portions 6303, operation keys 6304, a recording medium inserting portion 6305, and the like. In this mobile game machine, the display portion 6302 is structured using the same display device as the one described in Embodiment Mode 1. A feature of this display device is that uniform display without luminance unevenness can be provided by correction of a potential of a power source that drives a light emitting element, in accordance with changes in the properties of the light emitting element associated with a change in the ambient temperature depending on the usage environment, passage of operating time, or the like. Because of this feature, a mobile game machine realizing high picture quality that meets end user's demands and the sufficient life cycle, and capable of adapting to various usage environments can be provided to customers.

Figure 11E:
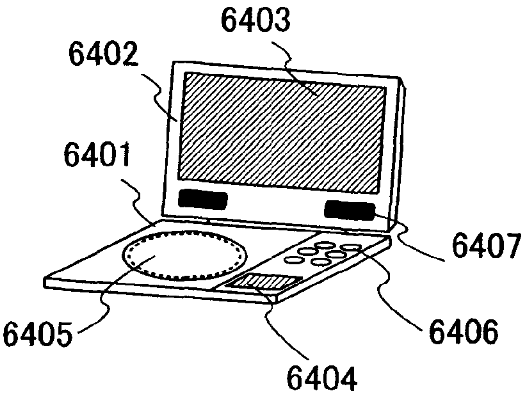

FIG. 11E shows a mobile image reproducing device equipped with a recording medium (specifically a DVD reproducing device), which includes a main body 6401, a housing 6402, a display portion A 6403, a display portion B 6404, a recording medium (such as a DVD) reading portion 6405, an operation key 6406, a speaker portion 6407, and the like. The display portion A 6403 mainly displays image information while the display portion B 6404 mainly displays text information. In this image reproducing device, the display portion A 6403 and the display portion B 6404 are structured using the same display device as the one described in Embodiment Mode 1. A feature of this display device is that uniform display without luminance unevenness can be provided by correction of a potential of a power source that drives a light emitting element, in accordance with changes in the properties of the light emitting element associated with a change in the ambient temperature depending on the usage environment, passage of operating time, or the like. Because of this feature, an image reproducing device realizing high picture quality that meets end user's demands and the sufficient life cycle, and capable of adapting to various usage environments can be provided to customers.

The display devices used in such electronic devices can be formed using not only a glass substrate but also a heat-resistant plastic substrate depending on the size, strength, and intended purpose; consequently, further reduction in weight can be achieved.

The examples described in this embodiment are just examples, and the present invention is not limited to the above-described applications.

This embodiment can be combined freely with any description of the above embodiment modes and embodiments.

This application is based on Japanese Patent Application serial No. 2006-001940 filed in Japan Patent Office on Jan. 7, 2006, the contents of which are hereby incorporated by reference.

What is claimed is:

1. A display device comprising:
a light-blocking layer;
an insulating layer formed over the light-blocking layer;
a first light emitting element formed over the insulating layer;
an opening formed in a portion of the insulating layer and overlapped with the light-blocking layer; and
a second light emitting element formed in the opening,
wherein the first light emitting element is formed in a pixel portion,
wherein the second light emitting element is formed in a monitoring element portion,
wherein the second light emitting element comprises:
a first electrode formed at the bottom of the opening;
a light emitting layer formed over the first electrode; and
a second electrode formed over the light emitting layer, and
wherein the second electrode has a light-blocking property.

2. The display device according to claim 1, further comprising a film having a light-blocking property, wherein the film covers a side surface of the opening.

3. The display device according to claim 1,
wherein the first light emitting element comprises:
a third electrode;
a second light emitting layer formed over the third electrode; and
a fourth electrode formed over the second light emitting layer wherein the forth electrode has a light-blocking property.

4. The display device according to claim 3, wherein the fourth electrode has reflectivity.

5. The display device according to claim 1, wherein the insulating layer includes at least one layer.

6. The display device according to claim 1, wherein the second electrode has reflectivity.

7. The display device according to claim 1,
wherein the second light emitting element is electrically connected to a correction circuit, and
wherein the correction circuit is electrically connected to the first light emitting element.

8. A display device comprising:
an light-blocking layer formed over a substrate;
an insulating layer formed over the light-blocking layer;
an opening formed in a portion of the insulating layer and overlapped with the light-blocking layer;
a film covering a side surface of the opening;
a first electrode formed in the opening and covering an edge of the film;
a light emitting layer formed in the opening with the first electrode interposed therebetween; and
a second electrode formed over the light emitting layer,
wherein the film has light-blocking property, and
wherein the second electrode has a light-blocking property.

9. The display device according to claim 8, wherein the insulating layer includes at least one layer.

10. The display device according to claim 8, wherein the second electrode has reflectivity.

11. The display device according to claim 8, further comprising a second light emitting element,
wherein a first light emitting element comprises the first electrode, the light emitting layer, and the second electrode,
wherein the first light emitting element is electrically connected to a correction circuit, and
wherein the correction circuit is electrically connected to the second light emitting element.

12. A method for manufacturing a display device comprising:
forming a light-blocking layer;
forming an insulating layer over the light-blocking layer;
forming an opening by removing a portion of the insulating layer, the portion being overlapped with the light-blocking layer;
forming a first electrode in the opening;
forming a first light emitting layer over the first electrode;
forming a second electrode over the first light emitting layer, wherein the second electrode has a light-blocking property;
forming a third electrode over the insulating layer;
forming a second light emitting layer over the third electrode; and
forming a fourth electrode over the second light emitting layer,
wherein the fourth electrode has a light-blocking property.

13. The method for manufacturing a display device according to claim 12, wherein the second electrode has reflectivity.

14. A method for manufacturing a display device comprising;
forming a light-blocking layer;
forming an insulating layer over the light-blocking layer;
forming an opening by removing a portion of the insulating layer, the portion being overlapped with the light-blocking layer;
covering a side surface of the opening with a film having a light-blocking property;
forming a first electrode in the opening and covering an edge of the film;
forming a first light emitting layer over the first electrode;
forming a second electrode over the first electrode, wherein the second electrode has a light-blocking property;
forming a third electrode over the insulating layer;
forming a second light emitting element layer over the third electrode; and
forming a fourth electrode over the second light emitting element layer,
wherein the fourth electrode has a light-blocking property.

15. The method for manufacturing a display device according to claim 14, wherein the second electrode has reflectivity.

16. A light emitting device including a pixel and monitoring element operationally connected to the pixel, the light emitting device comprising:

a light-blocking layer;

an insulating layer formed over the light-blocking layer wherein the insulating layer has an opening over the light-blocking layer;

a first light emitting element which is a part of the pixel formed over the insulating layer; and a second light emitting element which is a part of the monitoring element wherein the second light emitting element is formed in the opening and comprises:

a first electrode formed in the opening;

a light emitting layer formed over the first electrode; and a second electrode formed over the light emitting layer wherein the second electrode has light-blocking property.

17. The light emitting device according to claim 16 wherein the monitoring element is located outside of a pixel portion.

18. The light emitting device according to claim 16, wherein the first light emitting element is electrically connected to a correction circuit, and wherein the correction circuit is electrically connected to the second light emitting element.

* * * * *